United States Patent
Otaka et al.

(10) Patent No.: US 8,334,520 B2
(45) Date of Patent: Dec. 18, 2012

(54) CHARGED PARTICLE BEAM APPARATUS

(75) Inventors: Tadashi Otaka, Hitachinaka (JP); Hiroyuki Ito, Hitachinaka (JP); Ryoichi Ishii, Hitachinaka (JP); Manabu Yano, Hitachiohmiya (JP); Hajime Kawano, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/124,599

(22) PCT Filed: Oct. 22, 2009

(86) PCT No.: PCT/JP2009/068214
§ 371 (c)(1),
(2), (4) Date: Jul. 11, 2011

(87) PCT Pub. No.: WO2010/047378
PCT Pub. Date: Apr. 29, 2010

(65) Prior Publication Data
US 2011/0260057 A1   Oct. 27, 2011

(30) Foreign Application Priority Data

Oct. 24, 2008 (JP) .................. 2008-273986
Oct. 28, 2008 (JP) .................. 2008-277122

(51) Int. Cl.
*H01J 37/26* (2006.01)

(52) U.S. Cl. .................. 250/442.11; 250/310
(58) Field of Classification Search ............. 250/442.11, 250/440.11, 310, 306
See application file for complete search history.

(56) References Cited

U.S. PATENT DOCUMENTS

| 6,320,609 B1 | 11/2001 | Buchanan et al. |
| 7,295,314 B1 | 11/2007 | Spady et al. |
| 2007/0222991 A1 | 9/2007 | Spady et al. |
| 2012/0001069 A1* | 1/2012 | Kashihara ............ 250/310 |
| 2012/0001070 A1* | 1/2012 | Takagi ............ 250/310 |

FOREIGN PATENT DOCUMENTS

| JP | 08-162057 | 6/1996 |
| JP | 2000-207028 | 7/2000 |
| JP | 3389788 | 1/2003 |
| JP | 2007-059640 | 3/2007 |
| JP | 2008-024457 | 2/2008 |
| JP | 2008-305905 | 12/2008 |

OTHER PUBLICATIONS

English translation of the International Preliminary Report on Patentability and Written Opinion of the International Searching Authority issued in International Patent Application No. PCT/JP2009/068214, mailed Jun. 16, 2011.

* cited by examiner

*Primary Examiner* — Kiet T Nguyen
(74) *Attorney, Agent, or Firm* — McDermott Will & Emery LLP

(57) ABSTRACT

An exemplary a charged particle beam apparatus converts an inspection position on a test sample (wafer coordinate system) to a setting position of an inspection mechanism (stage coordinate system (polar coordinate system)), a rotating arm and a rotating stage being rotated to be moved for the inspection position on the test sample. In this case, inspection devices are arranged over a locus that is drawn by the center of the rotating stage according to the rotation of the rotating arm. A function for calculating errors (e.g., center shift of the rotating stage) and compensating for the errors is provided, by which the precision of inspection is improved in a charged particle beam apparatus equipped with a biaxial rotating stage mechanism.

19 Claims, 15 Drawing Sheets

101 --- SAMPLE CHAMBER
102 --- ROTATING ARM
103 --- ROTATING STAGE
104 --- CONTROL COMPUTER
105 --- MAN-MACHINE INTERFACE
106 --- STORAGE UNIT
107 --- INPUT DEVICE
108 --- WAFER TRANSFER UNIT
109 --- WAFER TRANSFER ROBOT
110 --- GATE VALVE
111 --- LOAD PORT
112 --- POD

101 ⋯ SAMPLE CHAMBER
102 ⋯ ROTATING ARM
103 ⋯ ROTATING STAGE
104 ⋯ CONTROL COMPUTER
105 ⋯ MAN-MACHINE INTERFACE
106 ⋯ STORAGE UNIT
107 ⋯ INPUT DEVICE

108 ⋯ WAFER TRANSFER UNIT
109 ⋯ WAFER TRANSFER ROBOT
110 ⋯ GATE VALVE
111 ⋯ LOAD PORT
112 ⋯ POD (A)

(B)

301 ⋯ INSPECTION MECHANISM MOUNTING POSITION (1)
302 ⋯ INSPECTION MECHANISM MOUNTING POSITION (2)
303 ⋯ INSPECTION MECHANISM MOUNTING POSITION (3)
304 ⋯ MARGIN (1)
305 ⋯ MARGIN (2)
306 ⋯ MARGIN (3)
307 ⋯ CHARGE MEASUREMENT INSTRUMENT MOUNTING POSITION
308 ⋯ CHARGE REMOVER MOUNTING POSITION
309 ⋯ EDGE/BEVEL INSPECTION MECHANISM MOUNTING POSITION

401 ··· INSPECTION MECHANISM MOUNTING POSITION (1)
402 ··· INSPECTION MECHANISM MOUNTING POSITION (2)
403 ··· INSPECTION MECHANISM MOUNTING POSITION (3)
404 ··· EDGE/BEVEL IINSPECTION MECHANISM
       MOUNTING POSITION

501 ··· LOCUS OF STAGE CENTER MARK ACCOMPANYING ROTATION
502 ··· STAGE CENTER SHIFT (X) ACCOMPANYING ROTATION
503 ··· STAGE CENTER SHIFT (Y) ACCOMPANYING ROTATION
504 ··· ERROR IN AMOUNT OF ROTATION

601 ··· STAGE ROTATION CENTER FROM OBSERVATION CENTER
602 ··· AFTER $\theta_1$ ADJUSTMENT
603 ··· MISALIGNMENT IN ROTATION ARM AXIS DIRECTION

701 ⋯ ON-SCREEN POSITION OF V-SHAPED NOTCH
702 ⋯ MISALIGNMENT OF WAFER CENTER

- 901 ··· INSPECTION MECHANISM (1) (OPTICAL INSPECTION DEVICE)
- 902 ··· INSPECTION MECHANISM (2) (OPTICAL MICROSCOPE, ETC.)
- 903 ··· INSPECTION MECHANISM (3) (CHARGED PARTICLE BEAM INSPECTION DEVICE)
- 904 ··· CHARGE MEASUREMENT INSTRUMENT
- 905 ··· CHARGE REMOVER
- 906 ··· EDGE/BEVEL INSPECTION MECHANISM
- 101 ··· SAMPLE CHAMBER
- 103 ··· ROTATING STAGE
- 102 ··· ROTATING ARM

CHARGED PARTICLE BEAM APPARATUS

RELATED APPLICATIONS

This application is the U.S. National Phase under 35 U.S.C. §371 of International Application No. PCT/JP2009/068214, filed on Oct. 22, 2009, which in turn claims the benefit of Japanese Application No. 2008-273986, filed on Oct. 24, 2008 and Japanese Application No. 2008-277122, filed on Oct. 28, 2008, the disclosures of which Applications are incorporated by reference herein.

TECHNICAL FIELD

The present invention relates to a charged particle beam apparatus and an optical wafer inspection apparatus used for inspection of test objects or the like.

BACKGROUND ART

With the miniaturization of semiconductor processes and the increase in the diameter of semiconductor wafers in recent years, inspection apparatuses for conducting dimensional inspection or microdefect inspection of micropatterns on a wafer using charged particle images or optical images are used a lot.

While the present semiconductor wafer size is 300 [mm] in radius, upsizing to 450 [mm] in radius in the near future is being examined.

Since the design rule of semiconductor devices has been miniaturized to 35 [nm] or less, measurement with higher precision is being required in the dimensional inspection and the defect inspection of patterns and higher resolution of the charged particle beam apparatus is being requested.

Meanwhile, in various types of such charged particle beam apparatuses and optical inspection apparatuses, the positioning to the image acquiring position is conducted by use of an XY stage which moves in two axis directions (x, y) orthogonal to each other. In the XY stage, the increase in the wafer size requires a proportional increase in the stroke of stage movement both in X and Y directions, causing enlargement of the installation area of the apparatus. Therefore, besides the enlargement and cost rise of the apparatus, image deterioration caused by microvibration of the sample stage has become a problem in the attempt to further increase the image resolution of the charged particle beam apparatus.

Further, a clean room equipped with such a charged particle beam apparatus has become extremely high-priced for attaining still higher cleanliness, preventing floor vibration, etc. Thus, cost reduction of the charged particle beam apparatus has been awaited.

To address these problems, Patent Document 1 discloses a charged particle beam apparatus in which the preliminary evacuation chamber is provided within the moving area of the sample stage. By eliminating the need of separately providing sample transfer means between the preliminary evacuation chamber and the sample chamber, the size of the apparatus is reduced.

Patent Document 2 discloses a charged particle beam apparatus employing the so-called biaxial rotating stage mechanism in which a rotatable sample stage is supported by a rotating arm. The configuration making it possible to drive and rotate the whole sample stage enables the downsizing of the sample stage, consequently realizing the downsizing of the whole apparatus.

PRIOR ART LITERATURE

Patent Documents

Patent Document 1: Japanese Patent No. 3389788
Patent Document 2: JP-8-162057-A

SUMMARY OF THE INVENTION

Problem to be Solved by the Invention

However, the technology described in Patent Document 2 does not disclose any technical finding or knowledge in regard to improvement of the precision of inspection adapting to the miniaturization of patterns on semiconductor wafers, without fully taking advantage of the strongpoint of the biaxial rotating stage mechanism (i.e., possibility of downsizing).

It is therefore an object of the present invention to realize a charged particle beam apparatus enabling improved precision of inspection adapting to the miniaturization of inspection target patterns while also being small-sized and low-priced.

Means for Solving the Problem

In order to achieve the above object, the present invention is configured as follows.

The charged particle beam apparatus or optical wafer inspection apparatus in accordance with the present invention comprises: a biaxial rotating stage mechanism including a rotating stage which rotates a sample (target of inspection or measurement) and a rotating arm which moves the rotating stage along an ark-shaped path; a plurality of inspection mechanisms arranged over the biaxial rotating stage mechanism for acquiring images of the target of inspection/measurement; and control means for controlling the biaxial rotating stage mechanism. The inspection mechanisms are arranged over a locus that is drawn by the rotation center of the rotating stage according to the rotation of the rotating arm.

The inspection mechanisms can include, for example, a charged particle optical lens tube, a dark field optical microscope, a bright field optical microscope and accessory devices necessary for the image acquisition. The charged particle optical lens tube has the function of irradiating the image acquiring position with a primary charged particle beam, detecting secondary charged particles generated by the irradiation, and outputting a signal corresponding to the detection. The dark field optical microscope has the function of irradiating the image acquiring position with light, detecting scattered light, and outputting a signal corresponding to the detection. The bright field optical microscope has the function of acquiring an image by irradiating the image acquiring position with light and causing reflected light to form an image. The accessory devices can include a charge remover and a flood gun, for example.

Effect of the Invention

The rotation center of the rotating stage can constantly be placed right under the inspection mechanism irrespective of the rotational position of the rotating arm. Thus, coordinate calculation for the wafer movement control and corrective calculation in cases of rotational errors are facilitated remarkably, reducing the load on the computing device used for the stage control. Consequently, an intended image position can be quickly moved to the position right under the inspection mechanism. Therefore, a charged particle beam apparatus or optical wafer inspection apparatus achieving both the improvement of the precision of inspection and the advantages of the biaxial rotating stage mechanism (small size, low price) can be realized.

MODE FOR CARRYING OUT THE INVENTION

Figure 1:
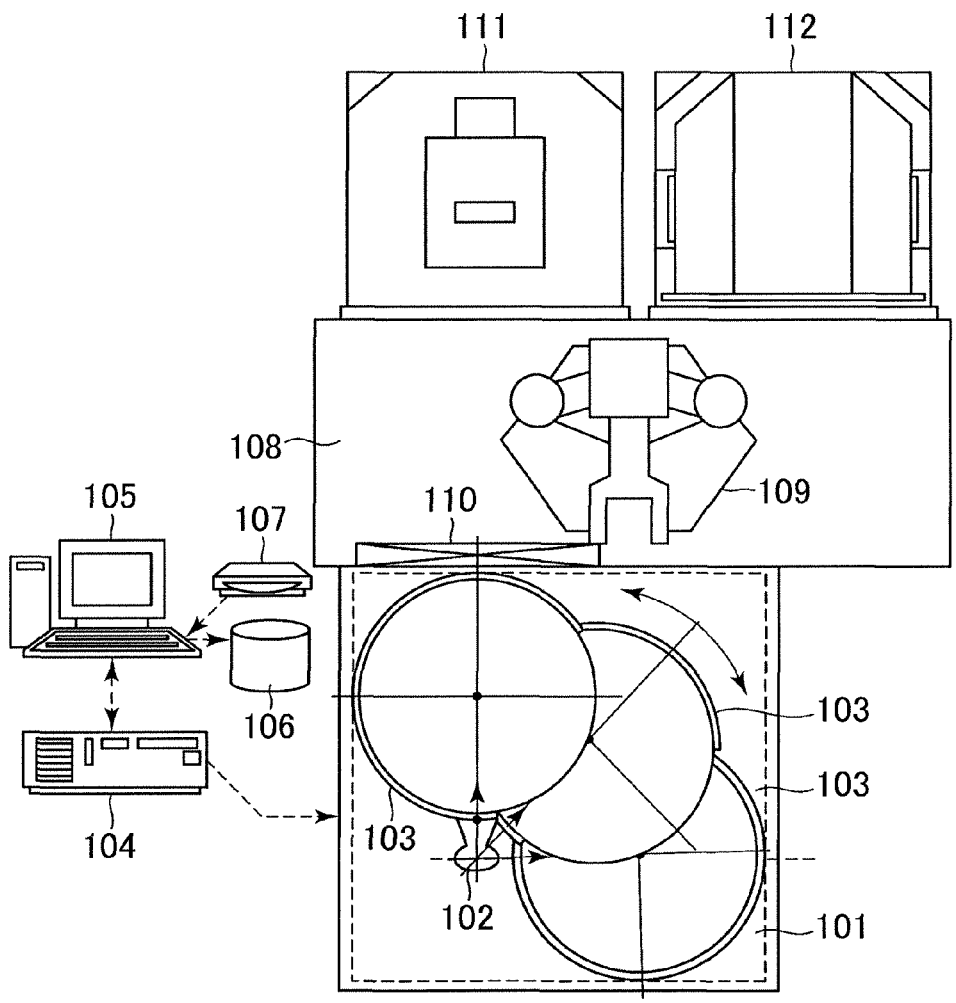
FIG. 1 is a schematic diagram showing the overall system configuration of a charged particle beam apparatus in accordance with an embodiment of the present invention.

Referring now to the drawings, a description will be given of preferred embodiments in accordance with the present invention.

Embodiment 1

FIG. 1 is a schematic diagram showing the overall system configuration of a charged particle beam apparatus in accordance with an embodiment of the present invention. The charged particle beam apparatus, of a type capable of handling large-diameter wafers, includes a biaxial rotating stage mechanism which is formed by a rotating arm mechanism and a rotating stage mechanism.

In the charged particle beam apparatus, various feature values regarding the surface of the sample are detected by keeping a sample chamber 101 in a high-vacuum state, irradiating the sample with a primary charged particle beam from above, detecting a secondary signal generated by the irradiation, and analyzing the detected secondary signal. Therefore, the charged particle beam apparatus in this embodiment is equipped with a charged particle optical lens tube (not illustrated), and an optical microscope (not illustrated), etc. The charged particle optical lens tube is used for irradiating the wafer with the primary charged particle beam and detecting secondary particles (secondary electrons or reflected electrons) generated by the irradiation. The optical microscope is used for acquiring a wide-area image for roughly determining the irradiating position of the primary charged particle beam. The charged particle beam apparatus may also be equipped with two or more charged particle optical lens tubes and/or two or more optical microscopes.

In the following explanation of this embodiment, a structure that is arranged above the rotating stage as a component necessary for realizing a function of the charged particle beam apparatus is referred to as an "inspection mechanism". Among devices within the category of charged particle beam apparatuses, length measurement SEMs, defect review SEMs and EB appearance inspection devices are used for acquiring images of a plurality of positions on a wafer with high precision. Such a device necessarily employs two or more inspection mechanisms since multiple images different in the visual field size have to be acquired in order to achieve high positioning accuracy of the image acquiring position.

The sample chamber 101 contains a biaxial rotating stage mechanism which includes a rotating arm 102 and a rotating stage 103. The rotating arm 102 and the rotating stage 103 are controlled by a control computer 104.

The rotating arm 102, having a rotating shaft supported by in-vacuum bearings, is installed to be rotatable. One end of the rotating arm 102 (opposite to the end where the rotating shaft is formed) is driven and rotated by a driving motor (not illustrated) implemented by piezoelectric elements. The rotating shaft is provided with a rotation angle detector (not illustrated). The end of the rotating arm 102 opposite to the end where the rotating shaft is formed is guided by a guide mechanism which supports the end. Since the rotating arm 102 is supported at both ends differently from the cantilever-like supporting, the arm 102 is resistant to external vibration and is driven and rotated along an ark-shaped path without wobbling.

The rotating stage 103 supported by the rotating arm is driven and rotated by a driving motor (not illustrated) implemented by piezoelectric elements.

When a sample wafer that should be inspected is designated by the operator through a man-machine interface 105, the designated wafer is extracted by a wafer transfer robot 109 from a pod 112 placed on a load port 111.

A wafer transfer unit 108 in which the wafer transfer robot 109 is installed is a typical sample wafer transfer mechanism which maintains a highly clean condition in order to prevent adhesion of foreign matter to the sample wafer. After purging the sample chamber 101 with air to the atmospheric pressure, a gate valve 110 is opened and the sample wafer is placed directly on the rotating stage 103. Then, the gate valve 110 is closed and the sample chamber 101 is evacuated again to a high-vacuum state. Thereafter, the inspection/measurement is carried out by irradiating the wafer with charged particles.

The man-machine interface 105 has an input mechanism 107 or a communication function equivalent thereto, through which design information and shot arrangement information on the semiconductor chips formed on the sample wafer can be inputted. The inputted information is held in a storage unit 106.

Figure 2:
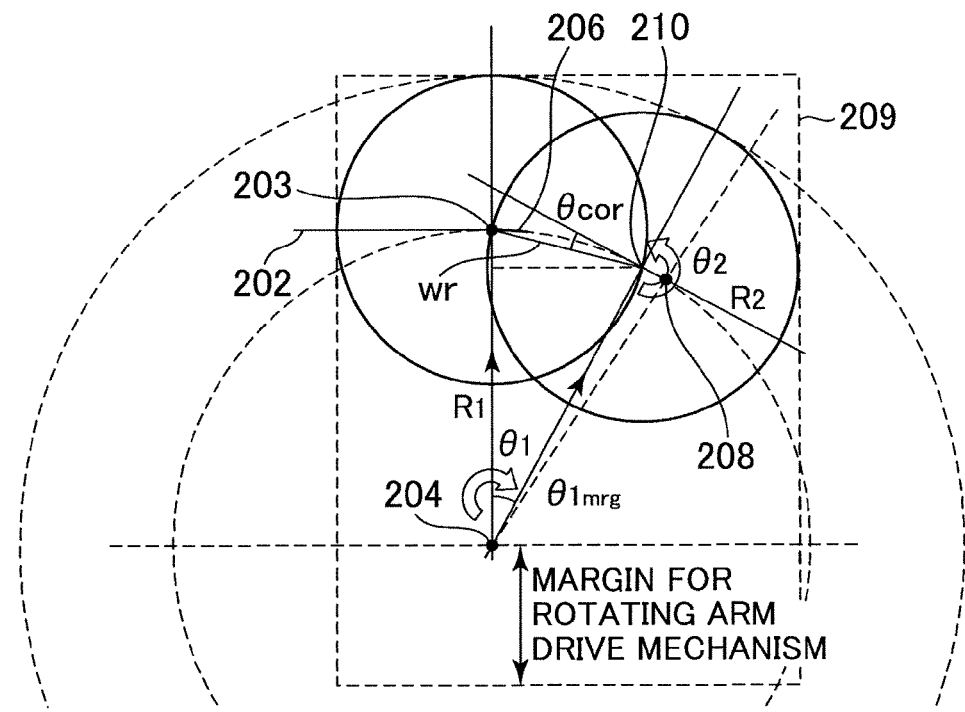
FIG. 2 is an explanatory diagram for explaining transformation from a wafer coordinate system to a stage coordinate system of a biaxial rotating stage mechanism.
Figure 2:
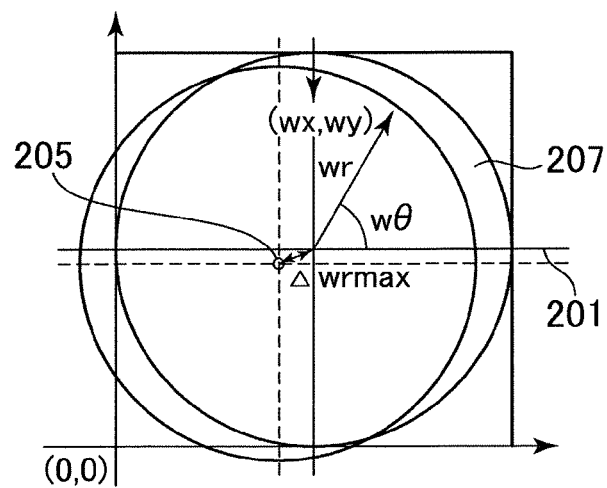

Coordinate transformation employed for the configuration described above will be explained here. FIG. 2 is an explanatory diagram showing an example of transformation from a wafer coordinate system 201 (assuming a 450 [mm] wafer) to a stage coordinate system 202 of the biaxial rotating stage mechanism. Calculations such as the coordinate transformation explained later are executed by the control computer 104.

FIG. 2(A) shows the overall arrangement of the biaxial rotating stage. In FIG. 2(A), the distance from a rotation center 204 of the rotating arm to the rotation center of the rotating stage 103 (i.e., turning radius of the rotating arm) is assumed to be R1, and a turning radius of the rotating stage 103 with respect to the rotation center 205 (i.e., radius of the rotating stage) is assumed to be R2. FIG. 2(B) is a schematic diagram showing the arrangement of the wafer and the rotating stage in the case where the wafer is placed on the stage with the wafer center misaligned with respect to the rotation center of the rotating stage.

In the charged particle beam apparatus of this embodiment, the aforementioned inspection mechanisms are arranged over a locus that is drawn by the rotation center of the rotating stage according to the rotation of the rotating arm. The biaxial rotating stage mechanism (generally having no mechanism for movement in the radial direction) implements the movement of the charged particle beam irradiating position on the wafer by the rotational movement only. By arranging the inspection mechanisms over the aforementioned locus, the rotation center of the rotating stage can be kept right under each inspection mechanism irrespective of the rotation of the rotating arm. Thus, by the arrangement of the inspection mechanisms over the locus, coordinate calculation for the wafer movement control and corrective calculation in cases of rotational errors are facilitated remarkably in comparison with other arrangements. This makes it possible to quickly move a desired position (part) on the wafer to the position right under the inspection mechanism.

Incidentally, while the Greek alphabet theta is used in the figures as a character representing an angle, the letter "S" is used in this specification instead of the Greek alphabet theta.

Next, the area occupied by the biaxial rotating stage mechanism is estimated under the above restraint condition that the inspection mechanisms are placed over the locus drawn by the rotation center of the rotating stage according to the rotation of the rotating arm. Referring to the arrangement of FIG. 2(A) in which the rotating stage whose turning radius (radius of the maximum wafer that can be set on the rotating stage) is R2 is held on the rotating arm whose turning radius is R1, a rectangle 209 indicated by dotted lines represents a rectangle required for accommodating the rotating arm and the area covered by the rotating stage when the rotating arm is rotated by a prescribed angle (S1, for example). Incidentally, the occupied area of the biaxial rotating stage mechanism is represented by a rectangle since the sample chamber storing the stage is generally in the shape of a rectangular parallelepiped.

As is clear from FIG. 2(A), when the turning radius R2 is given, the area of the rectangle 209 is determined by the rotation angle of the rotating arm and the occupied area of the rotating arm drive mechanism. Since the occupied area of the rotating arm drive mechanism is a fixed value, the minimum value of the occupied area of the biaxial rotating stage mechanism necessary for acquiring an image of the entire surface of the wafer (radius=R2) is determined by obtaining the minimum rotation angle of the rotating arm necessary for observing (or inspecting) the entire wafer surface. In the following explanation, the minimum rotation angle will be referred to as a "minimum necessary rotation angle".

Next, a basic concept regarding the way of determining the minimum necessary rotation angle will be explained below. The above arrangement of the biaxial rotating stage (in which the turning radius of the rotating arm is R1 and that of the rotating stage is R2) is assumed as shown in FIG. 2(A). The case where the rotating arm has rotated by an angle S1 from an appropriate origin of rotation will be considered below. The distance between the center position 203 of the rotating stage placed at the origin of rotation and the center position 210 of the rotating stage after the S1 rotation is assumed to be "wr". In the state in which the rotation center of the rotating stage is situated at the position 210, the inspection mechanism is situated right above the position 203. Thus, by rotating the rotating stage in this state, the charged particle beam apparatus can acquire wafer images along the circle (circumference) with the radius "wr" around the rotation center 210 by use of the inspection mechanism. From this, it is apparent that the acquisition of an image of the entire wafer surface by the rotation of the rotating stage requires a movable range 0 wr R2 of the rotating arm. Therefore, as to the minimum necessary rotation angle, it is enough to consider the angle S1 when wr equals R2 (hereinafter represented as "S1min").

In consideration of a simple condition for the similarity of triangles with respect to the arrangement shown in FIG. 2(A), the following equation (1a) is obtained.

$$wr = 2 \cdot R1 \sin(S1/2) \tag{1a}$$

If we neglect the rotational error of the rotating arm, the following equation (1) is obtained by substituting wr=R2 and S1=S1min (since the angle S1 when wr equals R2 is the minimum necessary rotation angle S1min) into the above equation (0).

$$S1\min = 2 \cdot \sin^{-1}\{R2/(2R1)\} \tag{1}$$

The rectangle capable of accommodating the area covered by the rotating stage (turning radius: R2) when the rotating arm moves within the range of the above equation (1) (i.e., circumscribing rectangle of the aforementioned area) corresponds to the minimum area of the sample chamber (assumed to be in the shape of a rectangular parallelepiped).

In contrast, in the cases where wr<R2, there exists an area that can not be positioned right under the position 203 even with the rotation of the rotating stage (the so-called "dead zone") in the peripheral part of the wafer.

As described above, in the charged particle beam apparatus in which the inspection mechanism is arranged over the locus drawn by the rotation center of the rotating stage according to the rotation of the rotating arm, the apparatus is equipped with a rotating arm whose minimum movable range satisfies a condition that the maximum inter-center distance of the rotating stage (maximum distance between rotation centers of the rotating stage) within the rotating arm's movable range is not less than the radius of the wafer to be inspected or measured, thereby realizing inspection, observation or measurement of the entire wafer surface.

In reality, the control accuracy of the rotating arm and the rotating stage has a certain limit and rotational errors (wobbling, etc.) due to mechanical errors etc. necessarily occur in the actual apparatus. Further, misalignment (positional error of the wafer) can be caused by a transfer error when the wafer is put on the stage. In the following, a method of controlling the biaxial rotating stage, taking the occurrence of errors (wobbling, misalignment, etc.) into account, will be explained.

Assuming that the inspection mechanism setting position 203 has been set to coincide with the rotation center 205 of the rotating stage when the amount of rotation of the rotating arm is 0, the rotation angle S1 of the rotating arm and a rotation angle S2 of the rotating stage necessary for moving an inspection point (wx, wy) (arbitrarily designated in the wafer coordinate system 201) to the inspection mechanism setting position 203 can be determined as follows.

First, the coordinates in the wafer coordinate system 201 are transformed into polar coordinates from the wafer center. In the case where the radius of the sample wafer is 450 [mm], the polar coordinates (wr, wS) obtained by the transformation satisfy the following equations (2-1) to (2-4).

$$wx-225=wr\cdot\cos(wS) \tag{2-1}$$

$$wy-225=wr\cdot\sin(wS) \tag{2-2}$$

$$wr=\sqrt{\{(wx-225)^2+(wy-225)^2\}} \tag{2-3}$$

$$wS=\tan^{-1}\{(wy-225)/(wx-225)\} \tag{2-4}$$

The rotating arm rotation angle S1, which is determined exclusively by wr, is expressed by the following equation (3).

$$S1=2\cdot\sin^{-1}\{wr/(2R1)\} \tag{3}$$

A visual field shift angle (Scor) caused by the rotation of the rotating arm by the angle S1 is expressed by the following equation (4).

$$Scor=S1-\cos^{-1}\{R1\cdot\sin(S1)/wr\} \tag{4}$$

From the above result, the rotation angle S2 of the rotating stage can be expressed by the following equation (5) using Scor and the angular component wS calculated from the wafer coordinates.

$$S2=-wS+Scor \tag{5}$$

In the biaxial rotating stage, the sample angle has changed at the point when the designated inspection point (wx, wy) has been moved to the position right under the inspection mechanism mounting position 203 (to be explained later). Therefore, in cases where a charged particle beam apparatus has been set at the inspection mechanism mounting position 203, an image in the correct direction can be acquired by making a visual field rotating correction by the angle Sr expressed by the following equation (6) by use of the well-known raster rotation function.

$$Sr=S1-S2 \tag{6}$$

Among the causes of the misalignment (positional error) in the wafer coordinate system 201 and the biaxial rotating stage coordinate system 202, deviation of the wafer center from the rotation center 205 of the rotating stage can be regarded as the most obvious one.

The deviation may be supposed to be on the order of some millimeters in cases where the sample to be inspected (wafer) is directly placed on the rotating stage 103 via no pre-alignment process.

If the movable range of the rotating arm 102 is set exactly equal to the minimum necessary rotation angle S1min specified by the equation (1), the aforementioned deviation causes an unobservable area in the outer part (peripheral part) of the sample wafer. Thus, the occurrence of such an outer dead zone can be prevented by setting the rotating arm's movable range as a range covering not only the minimum necessary rotation angle S1min but also a rotation angle margin S1mrg which is determined in consideration of a permissible deviation (permissible value of the deviation). In other words, the charged particle beam apparatus is equipped with a biaxial rotating stage having a rotating arm whose movable range covers the minimum necessary rotation angle S1min and the rotation angle margin S1mrg added together, thereby preventing the occurrence of the outer dead zone due to the deviation of the wafer center from the rotating stage rotation center 205.

If we represent the permissible deviation as "Δwrmax", the rotation angle margin S1mrg can be expressed by the following equation (7).

$$S1mrg=(\Delta wr\max/R1)[\text{rad}] \tag{7}$$

Conversely, in cases where the deviation of the wafer center from the rotating stage rotation center 205 is approximately 0, an inspection mechanism setting position margin 206 can be provided by the rotation angle margin S1mrg. Deviation of the rotating stage rotation center 205 from the center of observation (observation center) of the inspection mechanism mounting position 203 causes an unobservable area in an inner part (central part) of the sample wafer in the vicinity of the observation center.

The aforementioned provision of the inspection mechanism setting position margin 206 by the rotation angle margin S1mrg means that deviation of the setting position of the inspection mechanism (placed over the circumferential locus of the rotating stage rotation center 205 around the rotating arm rotation center 204) in the circumferential direction may be permitted to a certain extent.

In other words, the occurrence of the unobservable area in the inner-radius part of the wafer can be prevented irrespective of the setting position of the inspection mechanism as long as the setting position is within the inspection mechanism setting position margin 206. In the biaxial rotating stage mechanism shown in FIG. 2, another inspection mechanism mounting position 208 can be set.

The inspection mechanism mounting position 208 is set at a position obtained by rotating the inspection mechanism mounting position 203 in the rotating arm's circumferential direction by S1min+S1mrg or more. Since the control of the rotating arm 102 for the inspection mechanism mounting position 208 has to be executed reversely to that for the inspection mechanism mounting position 203, the occurrence of the unobservable area in the outer part can be prevented by determining the setting position at S1min+S1mrg or more.

Figure 3:
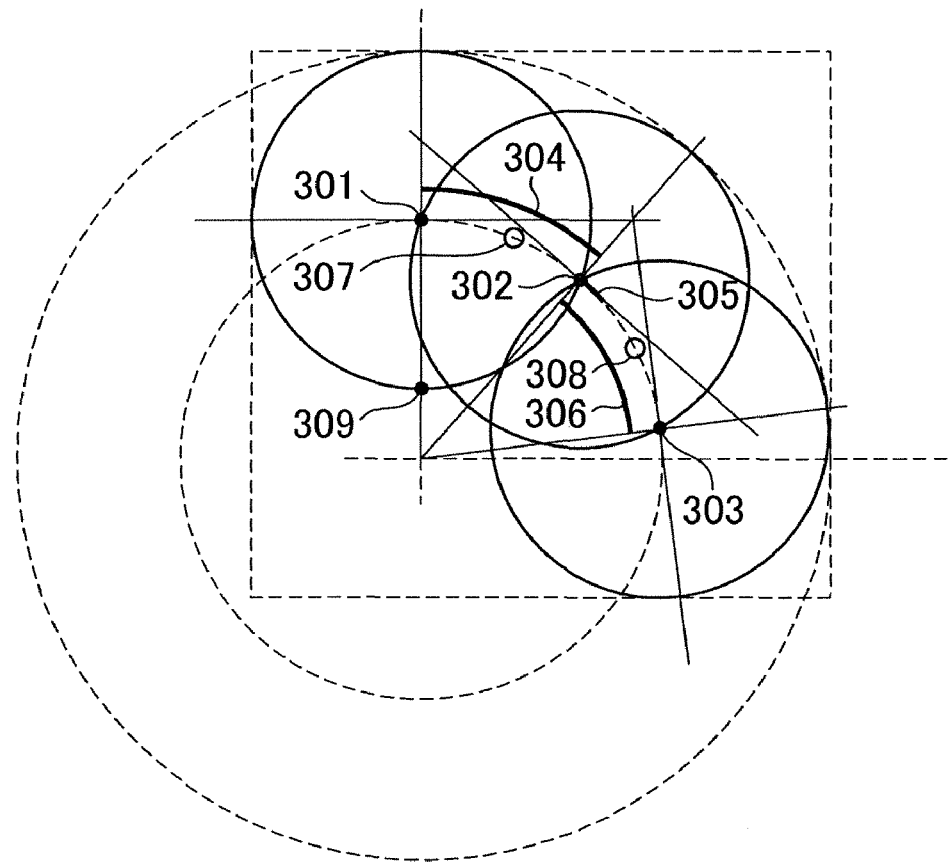
FIG. 3 is an explanatory diagram for explaining a case where an inspection mechanism setting margin is increased.

FIG. 3 shows another example expanding the above configuration. In this example, the inspection mechanism setting margin 206 is increased (margin 304) and the rotation angle margin S1mrg is set equal to the minimum necessary rotation angle S1min (S1mrg=S1min). With this setting (S1mrg=S1min), the entire arc connecting three typical inspection mechanism mounting positions (1) 301 to (3) 303 forms the inspection mechanism setting margin. The inspection mechanism setting margin can be realized by increasing the movable range of the rotating arm by an angle corresponding to the desired inspection mechanism setting margin.

The example of FIG. 3 is a specific example in which R1=300 [mm] and R2=225 [mm] (S1min=44.048626° and S1max=88.0973° in this case). This is an example in which R1 is set so as to allow the chamber to be as square as possible. The inside of the chamber 101 is designed employing X=Y=750 [mm] as minimum values, by which a margin of approximately 7.5 [mm] can be provided. This margin is an inspection mechanism setting margin (2) 305 which is available for the inspection mechanism mounting position (2) 302. For the other mounting positions, margins 301 and 303 corresponding to S1mrg=44.048626° are provided.

The inspection mechanism mounting position (2) 302 corresponds to the position for observing the edge face of the sample wafer when the center of the sample wafer is observed at the inspection mechanism mounting position (1) 301 or the inspection mechanism mounting position (3) 303. Assuming that a stage position corresponding to the inspection mechanism mounting position (1) 301 is a sample carry in/out position, the inspection mechanism mounting position (2) 302 is observing the edge face of the wafer when the sample is carried in.

A charged particle beam apparatus is often equipped with an optical microscope for observation of low-magnification images. Such an optical microscope can be used for the pre-alignment by placing it at the inspection mechanism mounting position (2) 302. Assuming that the carrying in of the sample wafer has a positional error (misalignment) of several millimeters, installation of a low-magnification optical microscope covering a probable area of the misalignment or combination of such an optical microscope with the rotational operation of the rotating stage 103 makes it possible to perform the calculation of a misalignment correction value (pre-alignment) in parallel with the closing of the gate valve 110 after the sample has been carried in, and the vacuum evacuation of the chamber. Here, the "pre-alignment" means the calculation of the correction value for compensating for the misalignment of the sample wafer center from the rotating stage rotation center 205. The parallel control sequence for such pre-alignment and in-vacuum transfer is conducted by the control computer 104.

Each inspection mechanism is capable of covering the entire sample wafer surface as long as the inspection mechanism is set anywhere on the arc connecting the inspection mechanism mounting positions (1) to (3) shown in FIG. 3. Therefore, improvement of inspection performance can be expected by installing auxiliary devices (specifically for the inspection of semiconductor devices) on the arc. For example, a device for measuring the charged electric field on the sample wafer surface and a device for removing the electric field may be installed at positions 307 and 308, respectively. The inspection performance can be improved also by setting an edge/bevel inspection mechanism at the position 309.

The mounting positions of auxiliary devices with respect to the inspection mechanism mounting positions 301 to 303 and 307 to 309 can be moved just by the driving of the rotating arm 102. Thus, the charge measurement and the charge removal operation can be conducted dynamically for each inspection point on the sample wafer, with improved precision compared to the conventional process for the whole surface. When such a process for the whole sample wafer surface is necessary, the whole-surface process can be carried out by conducting a mechanical scan (linear scan, spiral scan, etc.) on the sample surface by combining the driving of the rotating arm 102 with the driving of the rotating stage 103. Such a mechanical scan, which is implemented by controlling a scanning deflector installed in the charged particle optical lens tube, is controlled by the control computer 104 similarly to the stage control.

Figure 4:
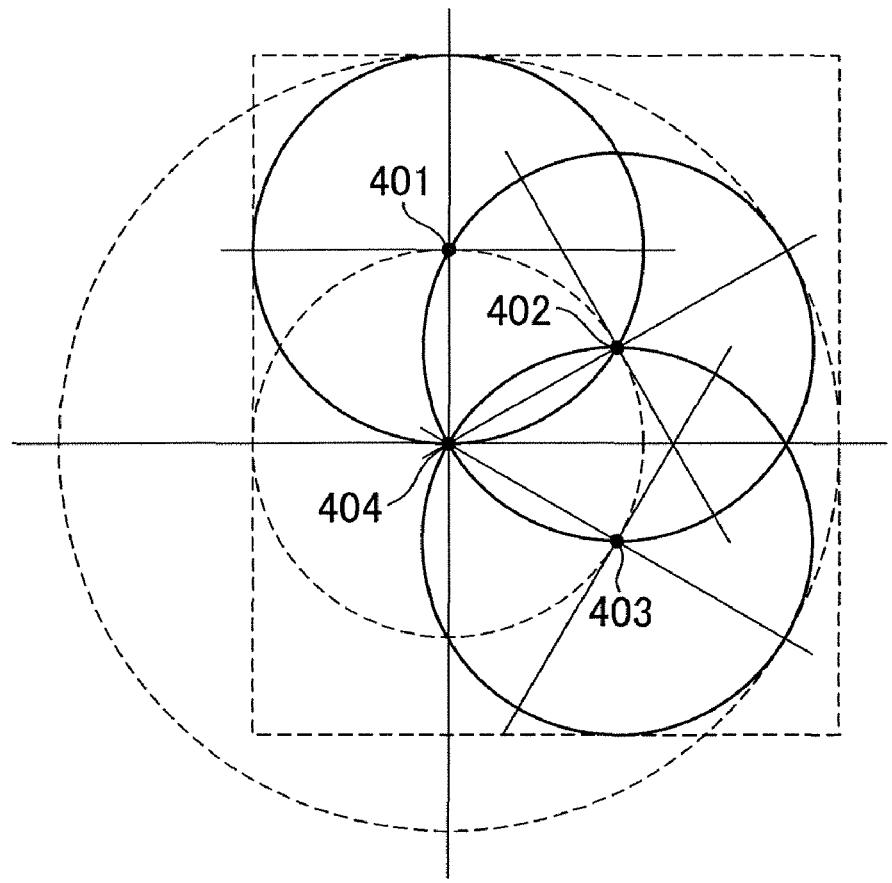
FIG. 4 is a diagram showing an example further expanding the configuration (a case where R1=R2).

FIG. 4 is a diagram showing an example further expanding the configuration (the case where R1=R2). In the example of FIG. 4, both R1 and R2 are set at 225 [mm] (S1min=60.0° and S1max=120.0° in this case). With this configuration, the rotation center 204 of the rotating arm always coincides with the periphery of the sample wafer irrespective of the angle S1 of the rotating arm. This position can be utilized as an edge/bevel inspection mechanism mounting position 404 of the sample wafer. For example, the pre-alignment (calculation of the correction value for compensating for the misalignment of the sample wafer's center from the rotating stage rotation center 205) is made possible by installing a low-magnification optical microscope at the edge/bevel inspection mechanism mounting position 404.

Further, also when pre-alignment for each inspection mechanism mounting position is necessary due to wobbling of the rotation center of the rotating arm, etc., the pre-alignment is possible by use of the low-magnification optical microscope installed at the edge/bevel inspection mechanism mounting position 404.

Furthermore, installation of a special-purpose inspection mechanism for quality control of the periphery of the sample wafer (attracting attention in recent years) makes it possible to expertly conduct the observation/check of foreign matter or peel-off on the side face of the sample wafer. The edge/bevel inspection mechanism mounting position 404 is unique in that sample rotation exclusively by mechanical rotation is possible (in an ideal state with no misalignment). Purposes and uses of inspection are greatly expanded through combination with obliquely arranged inspection mechanisms.

Incidentally, the reference numerals "401", "402" and "403" represent inspection mechanism mounting positions.

Next, an eccentricity compensation function for compensating for eccentricity of the rotating stage will be explained below. In order to conduct the positioning control by use of the biaxial rotating stage mechanism explained above, eccentricity of the rotating stage 103 (the degree of the wobbling of the rotation center axis of the rotating stage 103) has to be measured precisely in advance. The wobbling of the rotation center axis is measured using a mark having directivity (arrow, cross, etc.) put at the center of the rotating stage 103. This measurement is performed by acquiring images of the mark by using one of the inspection mechanisms having an image detecting function. Specifically, variations in the position of the stage rotation center are detected by acquiring images containing the mark in the visual field while rotating the rotating stage 103 from its origin of rotation, and by executing image processing with the control computer 104. This sequence is continued until the rotating stage 103 turns 360°.

Figure 5:
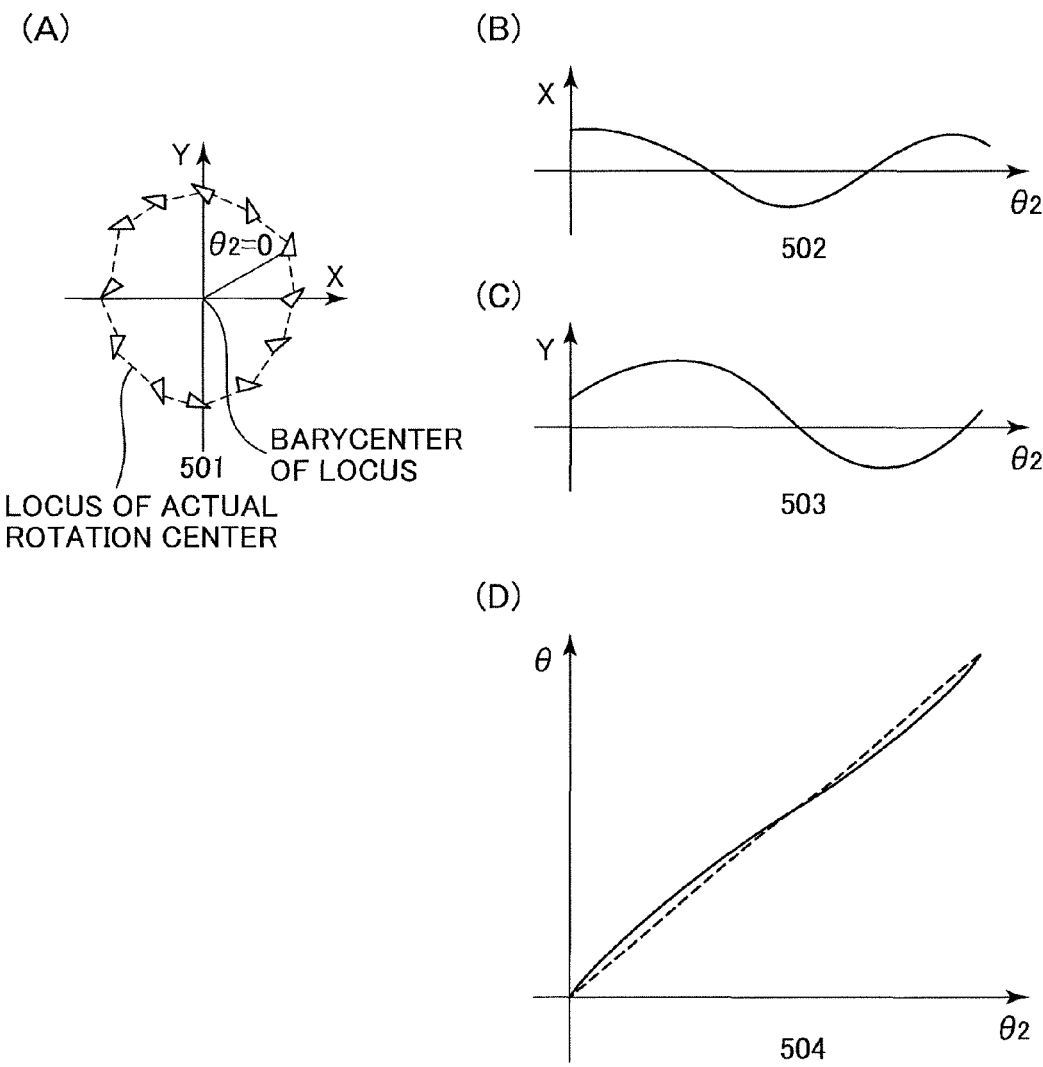
FIG. 5 is an explanatory diagram for explaining wobbling of a rotation center axis.

The wobbling of the rotation center axis will be explained referring to FIGS. 5(A) to (D). FIG. 5(A) shows the locus of actual movement of the rotation center, wherein the locus is drawn by placing the barycenter of the locus at the center. When the rotation angle of the rotating stage is at a specific angle, the rotating stage is rotating around the mark's position corresponding to the specific angle. The mark shown in FIG. 5(A) is continuously extracted by image processing concurrently with the start of rotation, thereby generating data of the locus 501 of the mark accompanying the rotation. The locus data is represented by, for example, deviation of the rotation center from the ideal value/position (X-direction shift 502 and Y-direction shift 503 from the ideal rotation center) obtained for the rotation angle S2 of the rotating stage. The deviation is calculated from the acquired image by pixel calculation.

At the same time, an error 504 in the amount of rotation with respect to a designated rotation angle of the rotating stage is measured based on the direction of the mark. Since the mark has directivity, if there is no error in the amount of rotation, the mark's direction in the case where the mark is rotated by the designated rotation angle of the rotating stage coincides with a direction determined from the mark's image acquired after rotating the rotating stage by the designated rotation angle. Therefore, the error in the amount of rotation can be determined by executing a comparison operation between the actually acquired mark's image and a reference image obtained by in-computer rotation of pixel data corresponding to the mark.

The aforementioned deviation and the above error in the amount of rotation are calculated by the control computer 104 and stored in the storage unit 106 while associating them with the rotating stage rotation angle S2. The stored values of the deviation and the error in the amount of rotation are used as correction values for the control of the rotating stage.

The locus data stored as described above represents the wobbling (shift) of the rotation center 205 of the rotating stage. The area inside the locus is an unobservable area. Once the locus data has been obtained, the aforementioned shift corresponding to the rotation angle S2 of the rotating stage 103 can be estimated by referring to the locus data. While the rotation angle S2 is determined by the aforementioned equation (5), the axis shift caused by this is added to the wafer coordinate system and the calculation is executed again from the rotating arm rotation angle S1 by using the equation (2).

Since this calculation oscillates approximately within the detecting resolution of the rotation angle, the calculation process is ended when the variation in the calculation result is detected to be less than a predetermined threshold value. When the number of calculations enough for the convergence of the calculation result is empirically obvious, the rotation angles S1 and S2 are determined by repeating the calculation for a fixed number of times. The calculation process described above is also executed by the control computer 104.

During observation of the unobservable area, irradiating position adjustment (image shift) is conducted by the charged particle beam apparatus. Since the maximum correction possible by the irradiating position adjustment (approximately ±15 μm) is dependent on the performance of the charged particle optical lens tube, the rotation axis shift (wobbling) due to the eccentricity has to be corrected so that the axis shift fits in the possible range of the image shift. For this, it is necessary to precisely measure misalignment (positional error) of the rotating stage rotation center from the observation center of the inspection mechanism.

Therefore, misalignment (positional error) of the barycenter of the locus (representing the wobbling of the rotating stage rotation center 205) from the observation center in the visual field is measured. Since coordinate information on the observation center has already been given, it is possible to calculate coordinates of the barycenter from the positional information on the locus and then calculate the difference between the barycenter coordinates and the coordinates of the observation center. The process of calculating the barycenter coordinates and the difference is executed by the control computer 104. The calculated misalignment of the stage rotation center from the observation center is stored in the storage unit 106.

Misalignment of the rotating arm 102 on the circumference in the rotation angle S1 direction is used for the positioning calculation as an adjustment value for the control value S1 of the rotating arm 102.

Figure 6:
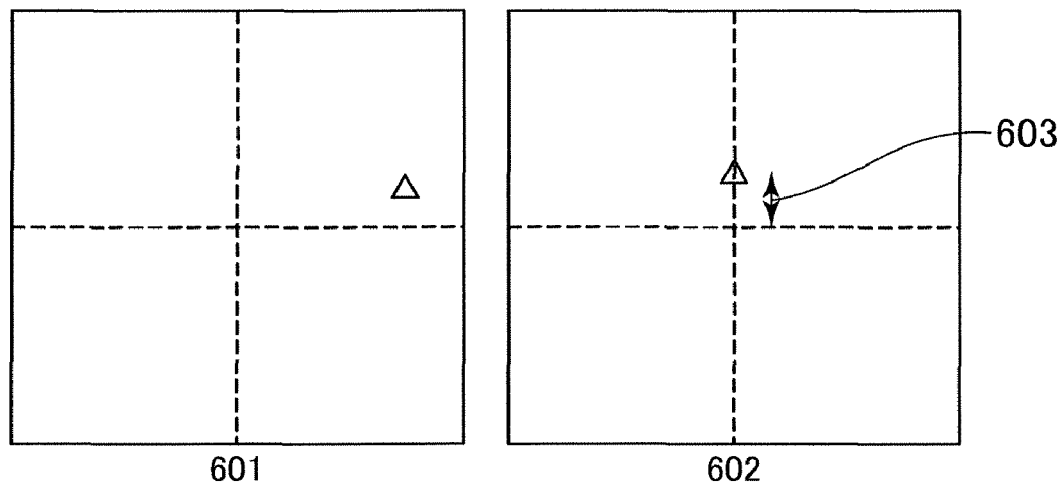
FIG. 6 is an explanatory diagram for explaining measurement of misalignment of the rotation center of the rotating stage from the observation center.

As shown in FIG. 6, misalignment 603 in a rotating arm axis direction, which has occurred at the rotation center 602 after carrying out the S1 adjustment to the rotating stage rotation center 601 before adjustment, forms an inner unobservable area. This misalignment is used as a moving distance when the visual field is moved in the irradiating position adjustment (image shift) conducted by the charged particle beam apparatus. Since the maximum distance of the visual field movement possible by the image shift is dependent on the charged particle optical lens tube as mentioned above, adjustment has to be made so that misalignment of the observation center fits in the range.

The measurement of the axis shift (wobbling) of the rotating stage rotation center 205 and the misalignment of the rotating stage rotation center 205 from the observation center which have been explained above is carried out in the maintenance of the apparatus, following the temporal change of the wobbling and the misalignment.

Next, a method for precisely measuring the misalignment of the wafer center with respect to the rotating stage rotation center 205 will be explained. The misalignment measurement is conducted by use of a low-magnification observation instrument (optical microscope, CCD camera, etc.) placed at the edge/bevel inspection mechanism mounting position 309 shown in FIG. 3. In an example of this embodiment, the sample wafer is placed at an arbitrary position/direction having a certain level of likelihood on the rotating stage 103. After setting the sample wafer on the rotating stage 103, the measurement is performed by acquiring images of the edge of the wafer with the aforementioned optical microscope, CCD camera or the like while rotating the rotating stage 103 at a constant speed under the control of the control computer 104.

The control computer 104 analyzes video image data obtained from the observation device and thereby detects a part of the wafer's edge face that is not in the curved shape, that is, a V-shaped notch part. When the V-shaped notch part is detected, the rotating stage 103 is stopped temporarily. Thereafter, the rotating stage 103 is rotated until the V-shaped notch part (originally at the stopped position) is oriented in a 270° direction of the sample chamber 101 (i.e., direction opposite to the gate valve 110), and the rotating stage 103 is then stopped.

Figure 7:
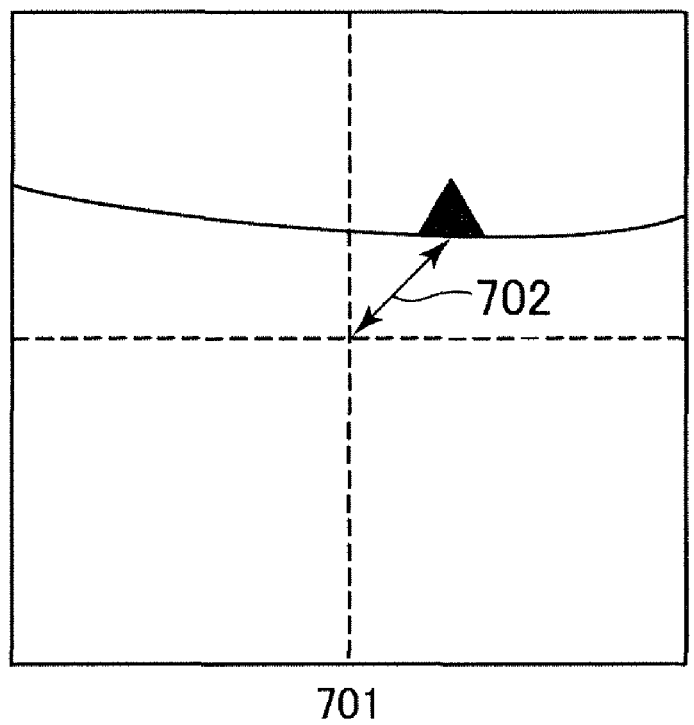
FIG. 7 is an explanatory diagram for explaining measurement of misalignment of the wafer center from the rotation center of the rotating stage.

Angle information on the rotating stage at this point is stored in the storage unit 106. As shown in FIG. 7, the control computer 104 calculates the misalignment 702 of the wafer center based on the on-screen position 701 of the V-shaped notch oriented in the 270° direction, corrects the calculated misalignment 702 by adding and subtracting the axis shift of the rotating stage based on the angle of the rotating stage at this point, and stores the corrected misalignment 702 in the storage unit 106.

At the same time, the angle of the rotating stage 103 when the sample wafer was carried in is also stored in the storage unit 106. In general, this angle is employed as the origin of rotation. When the sample wafer is taken out of the chamber, the carry-in position is reproduced by rotating the stage to the stored angle of the rotating stage. With the deterioration in the positional adjustment of the wafer transfer robot 109 and the load port 111, the misalignment of the sample wafer center can increase considerably. In such cases, depending on the rotation angle of the rotating stage 103, the (X, Y) position relationship between the sample wafer and the pod 112 can change, causing interference or collision of the sample wafer with the pod 112. The possibility of such accidents can be reduced by the reproduction of the sample wafer carry-in position.

Figure 8:
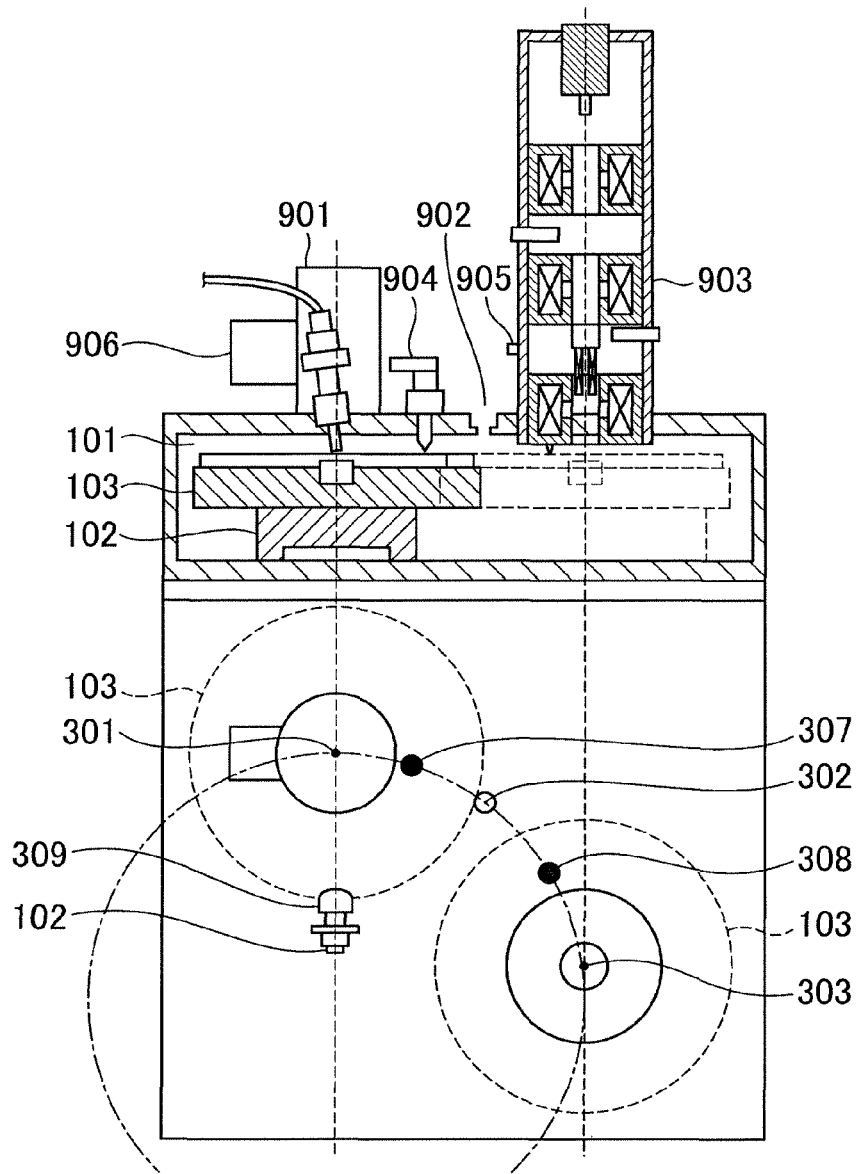
FIG. 8 is an explanatory diagram for explaining the correspondence between inspection mechanisms etc. and their mounting positions shown in FIG. 3.

FIG. 8 is a sectional side view of the charged particle beam apparatus of FIG. 3, showing the correspondence between the inspection mechanisms etc. and their mounting positions. In FIG. 8, the reference numerals "901" to "903" represent inspection mechanisms, wherein "901" represents an optical inspection device, "902" represents an optical microscope, and "903" represents a charged particle optical lens tube. A charge measurement instrument 904, a charge remover 905 and an edge/bevel inspection mechanism 906 are arranged at the top of the sample chamber 101. The optical inspection device 901 is installed at a position corresponding to the mounting position 301. The optical microscope 902 is installed at a position corresponding to the mounting position 302. The charged particle optical lens tube 903 is installed at a position corresponding to the mounting position 303.

The charge measurement instrument 904, the charge remover 905 and the edge/bevel inspection mechanism 906 are installed at positions corresponding to the mounting positions 307, 308 and 309, respectively.

Figure 9:
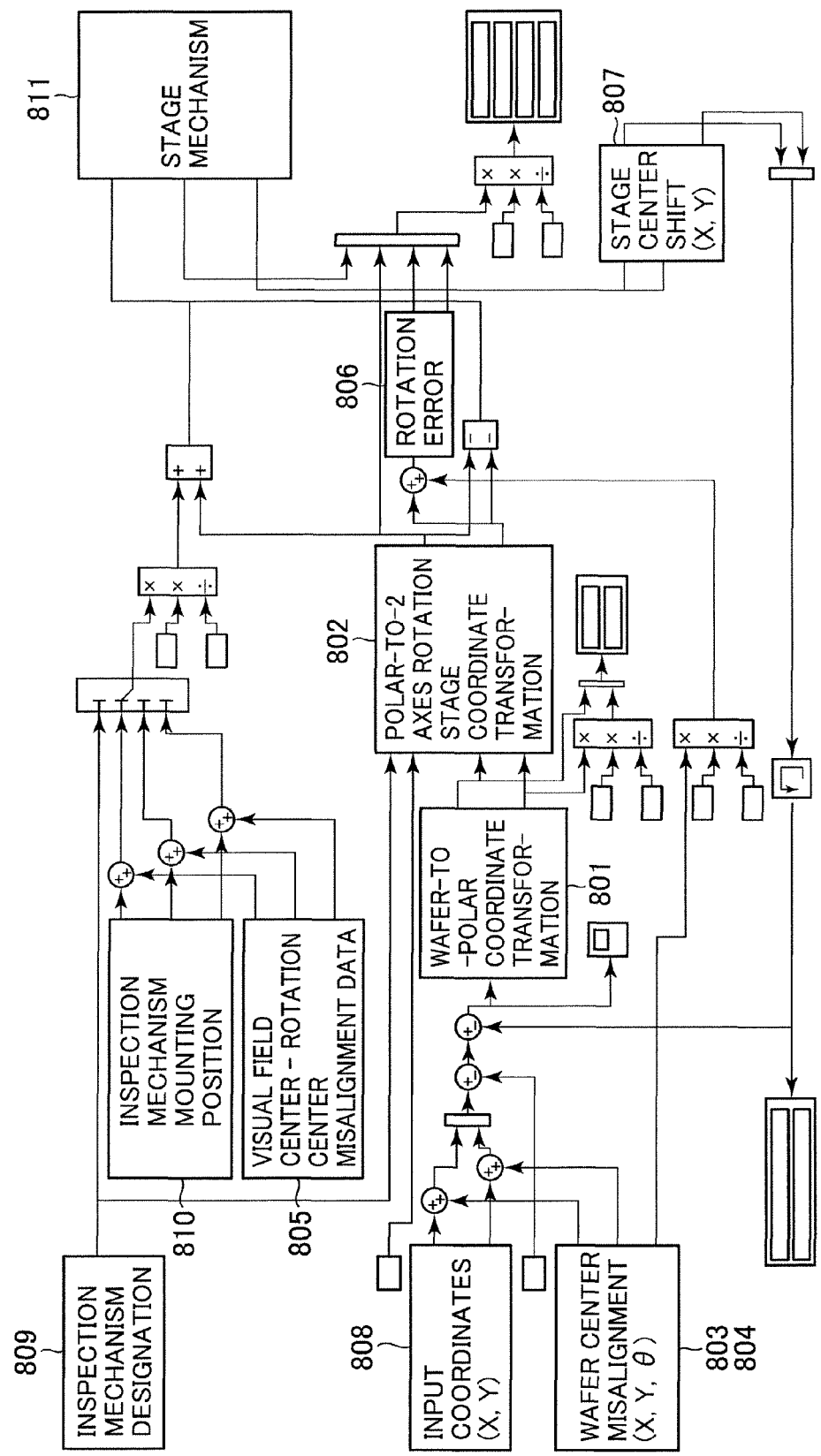
FIG. 9 is a block diagram of a processing unit which executes a positioning process for the biaxial rotating stage in the embodiment of the present invention.

FIG. 9 is a block diagram of a processing unit which executes a positioning process for the biaxial rotating stage based on the correction values obtained as described above. The processing unit is implemented in the control computer 104 shown in FIG. 1. The implementation is possible in two forms: hardware implementation (implementing the functional blocks shown in FIG. 9 with special-purpose chips) and software implementation (configuring the functional blocks with programs executed by a calculation unit of the control computer 104). The following explanation will be given assuming that the processing unit has been implemented by the software implementation.

In FIG. 9, the processing unit for the positioning process is roughly composed of two units: a wafer-to-polar coordinate transformation unit 801 and a polar-to-biaxial rotating stage coordinate transformation unit 802 (for the coordinate transformation from the polar coordinate system to the biaxial rotating stage coordinate system).

The wafer-to-polar coordinate transformation unit 801 executes the calculation of the equation (2). The polar-to-biaxial rotating stage coordinate transformation unit 802 executes the calculations of the equations (3) to (5). Before the wafer-to-polar coordinate transformation is executed to the wafer coordinates 808 of the image acquiring position inputted by an operator or loaded from a recipe file, the misalignment of the wafer center has to be compensated for in the wafer coordinates 808. Thus, the inputted coordinates 808 are corrected (increased or decreased depending on the quadrant in the X-Y coordinate system) by previously calculated wafer center misalignment (X, Y) data 803. Meanwhile, wafer center misalignment (S) data 804 is data representing the rotation angle of the rotating stage which was rotated in order to orient the V-shaped notch part in the 270° direction of the sample chamber 101. Thus, the rotating stage rotation angle calculated by the polar-to-biaxial rotating stage coordinate transformation unit 802 is corrected (increased or decreased) by this wafer center misalignment (S) data 804.

In the meantime, a plurality of inspection mechanism mounting positions 810 have been stored in the storage unit 106 as offsets of the rotating arm rotation angle information. A selection is made from the stored inspection mechanism mounting positions 810 depending on the inspection mechanism(s) to be operated. For example, the charged particle beam apparatus carries out two-step positioning for the positioning of the image acquiring position. Namely, the apparatus first acquires a low-magnification image with the optical microscope and then determines the charged particle beam irradiating position using the low-magnification image. In this case, the optical microscope and the charged particle optical lens tube are used as the inspection mechanisms in this order. Accessory devices (photoflood gun, charge remover, etc.) may also be used depending on the type of the inspection/measurement. The inspection mechanisms to be used are selected automatically in the setting of the inspection recipe or measurement recipe. Inspection mechanism designation 809 is inputted by reading out the recipe file. The setting of the inspection recipe or measurement recipe is made through the man-machine interface 105.

The control computer 104 drives and rotates the rotating arm according to the order of execution of the image acquisition sequence, thereby moving the image acquiring position to the position right under the inspection mechanism to be used. The selected offset value is read out from the storage unit 106 and used when the arm is driven and rotated.

Since the rotating stage rotation center has misalignment with respect to the observation center of each inspection mechanism (901 to 906), a visual field center misalignment compensation is executed by correcting (increasing or decreasing) the rotating arm rotation direction (arm rotation angle) by data 805 representing misalignment of the rotating stage rotation center with respect to the correctable visual field center. Misalignment in the rotating arm axis direction, for which compensation by the biaxial rotating stage is impossible, is absorbed separately by a correction by means of the irradiating position adjustment (image shift).

To the rotating arm rotation angle for each inspection mechanism (901 to 906) which has been determined as above, the rotating arm rotation angle calculated by the polar-to-biaxial rotating stage coordinate transformation unit 802 is added, by which a rotating arm control angle is determined.

Meanwhile, the rotating stage angle data calculated by the polar-to-biaxial rotating stage coordinate transformation unit 802 is corrected (increased/decreased) by the wafer center misalignment (S) data 804 and then corrected by data 806 representing the previously measured error in the amount of rotation, by which a rotating stage control angle is determined.

Further, since the stage center shift occurs to the rotating stage control angle determined here, the amount of the shift is calculated from data 807 (representing measured stage center shift (X, Y) accompanying the rotation) and the calculation result is fed back to the wafer coordinate system, by which determination of a balanced control value becomes possible.

Furthermore, the positioning accuracy has to be increased by precisely measuring positions of the semiconductor design pattern. The pattern on the sample wafer is determined so that the rotating arm 102 and the rotating stage 103 operate to the maximum. On the stage of the biaxial rotating stage mechanism, this requirement is satisfied by selecting arbitrary three points arranged at both ends of a diameter passing through a point in the vicinity of the center of the sample wafer.

Thus, the control computer 104 automatically determines an intra-chip pattern of arbitrary three points (arranged at both ends of a diameter passing through a point in the vicinity of the center of the sample wafer) based on data created by the operator through the man-machine interface or semiconductor design data acquired by the input mechanism 107 or a communication function equivalent thereto. Before the start of an inspection process by each inspection mechanism, the control computer 104 detects the intra-chip pattern by image processing and finely corrects the wafer center misalignment based on the detected positions of the intra-chip pattern, thereby improving the positioning accuracy.

This correction can be made also by making a correction to information on semiconductor arrangement on the sample wafer. In cases where the semiconductor arrangement has distortion, further improvement of the precision can be expected by further determining (setting) chips on a circumference nearby the edge of the sample wafer.

The semiconductor arrangement information correction data on the sample wafer created by the above procedure can be regarded to have an extremely high possibility of reuse for sample wafers of the same product/process in the development of the precision-improving technology accompanying the miniaturization of semiconductors in recent years.

Therefore, the throughput of the charged particle inspection apparatus can be increased by storing the semiconductor arrangement information correction data in the storage unit 106 while associating the data with an identification code representing the semiconductor product and the process (lot number of the wafer, wafer ID, process number, etc.), and by using the stored code (i.e., leaving out the positioning process) in subsequent inspections of the same product/process.

Incidentally, the positioning accuracy can be maintained at a uniform level by occasionally correcting the semiconductor arrangement information correction data based on positional information obtained in some steps (detection of the position of length measurement, detection of a defect pattern, etc.) of the inspection process (learning function). The learned information for the correction of the semiconductor arrangement information correction data may be deleted by issuing an instruction through the man-machine interface 105 when mechanism adjustments etc. have been carried out in periodic maintenance. The deletion allows the semiconductor arrangement information correction data to be created again through the positioning process. The movement (movable range) of the rotating arm can cover the whole area of the wafer in cooperation with the rotating stage if the arm's stroke is approximately half the wafer diameter.

As described above, in this embodiment, the inspection position of the test sample is moved to the arrangement position of the inspection mechanism by executing the transformation from the inspection position of the test sample (wafer coordinate system) to the arrangement position of the inspection mechanism (stage coordinate system (polar coordinate system)) and rotating the rotating arm 102 and the rotating stage 103. In this process, calculation of errors such as the center shift of the rotating stage 103 and compensation for the calculated errors are made possible. Thus, the precision of inspection by a charged particle beam apparatus having a biaxial rotating stage mechanism can be improved adapting to the miniaturization of patterns to be inspected.

Further, since a plurality of inspection mechanisms are arranged over the locus drawn by the center of the rotating stage 103 moving according to the rotation of the rotating arm 102, a charged particle beam apparatus capable of multiple types of inspections while being compact can be realized.

Furthermore, since the stage is downsized, the sample chamber enclosing the stage can also be downsized. Consequently, external vibration can be prevented through improvement of rigidity, as well as realizing high-speed vacuum evacuation (thanks to the decrease in the vacuum capacity) and cost reduction.

Specifically, the angle of the wafer in the direction of rotation has a deviation from the scanning direction of the charged particle beam apparatus at the point when the positioning is finished. Therefore, a correction is made to the scanned particle beam by a calculated angle (rotation angle correction), by which an erect image with respect to a predetermined direction (e.g., direction of the notch of the wafer) can be acquired constantly.

In this embodiment, the setting margin for the inspection device is provided by first determining the necessary moving range (rotation angle S1) of the rotating arm 102 from the turning radii R1 and R2 of the rotating arm 102 and the rotating stage 103 and then expanding the determined moving range. By further increasing the setting margin, mountable positions (mountable ranges) of typical inspection mechanisms can be expanded while also implementing the compensation for the misalignment (positional error) by the amount of rotation (S1) of the rotating arm.

Further, the center axis shift (wobbling) of the rotating stage 103, the misalignment of the center of the rotating stage 103 with respect to the observation center, the misalignment of the sample wafer center with respect to the center of the rotating stage 103, and the misalignment of the processed micropattern with respect to the sample wafer are calculated by the control computer 104 as feature values causing the misalignment (positional error) at each inspection device. The correction in the positioning is carried out by transforming the calculated information into two rotating coordinate systems.

Embodiment 2

Next, another embodiment of the present invention will be described.

Figure 10:
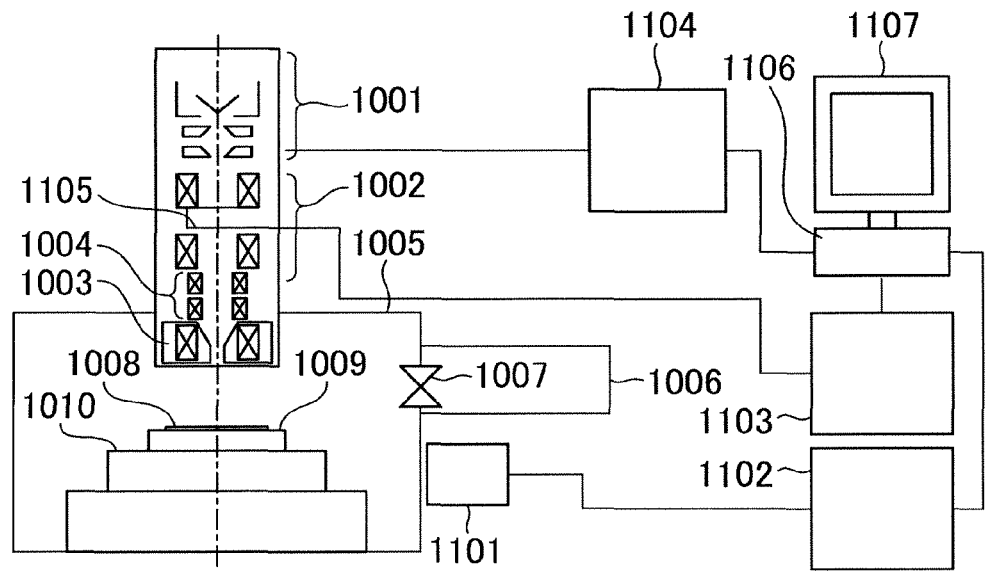
FIG. 10 is a schematic block diagram of a charged particle beam apparatus (length measurement SEM, defect review SEM, etc.) to which the present invention is applied.

FIG. 10 is a schematic block diagram of a charged particle beam apparatus according to this embodiment. This charged particle beam apparatus is used, for example, as a length measurement SEM, defect review SEM, etc. For convenience of explanation, this embodiment will be described taking an electron beam apparatus as an example. While a semiconductor wafer will mainly be cited as the target of inspection (target sample), this charged particle beam apparatus is adaptable also to a liquid crystal panel, a stepper mask, a general sample for analysis, etc.

In FIG. 10, an electron gun 1001, a converging lens 1002 and an objective lens 1003 are controlled by a lens/deflector control unit 1104. An electron beam is converged on a wafer 1008. The electron beam deflected by a deflector 1004 is scanned over the wafer 1008 supported on a wafer support table 1009. Electrons generated by the scanning are detected by a detection system 1105. The detected signal undergoes signal processing by a detection system control unit 1103 and is further processed by a system control/image processing device 1106. Dimensions of the micropattern can be measured based on a detected electron profile signal while displaying acquired images on a screen 1107. This electron beam apparatus is usable also for increasing the yield of semiconductor processes (e.g., inspection for defects in a pattern).

A sample stage 1010, on which the sample support table 1009 is mounted, is driven by a stage driving unit 1101 which is controlled by a stage control unit 1102. A sample chamber 1005 is connected with a load lock chamber 1006. A gate valve 1007 is provided between the sample chamber 1005 and the load lock chamber 1006.

When an inspection of dimensions or defects is conducted for a micropattern formed on a semiconductor wafer 1008, the wafer 1008 set on the wafer support table 1009 is moved by the sample stage 1010, by which a pattern position on the wafer as the target of inspection is moved to the position under the electron beam irradiating position. In conventional semiconductor measurement devices and inspection devices employing a charged particle beam apparatus, a stage according to the X-Y orthogonal coordinate system is generally used as the sample stage, enabling the wafer movement in a horizontal plane. This type of stage employing the X-Y orthogonal coordinate system has two moving mechanisms (one for the X direction and the other for the Y direction) which are stacked up. Such a stage mechanism tends to be thick in the vertical direction. Further, since the necessary stroke of the mechanism in the horizontal direction increases with the increase in the wafer diameter, the sample chamber is likely to increase in size.

Figure 11:
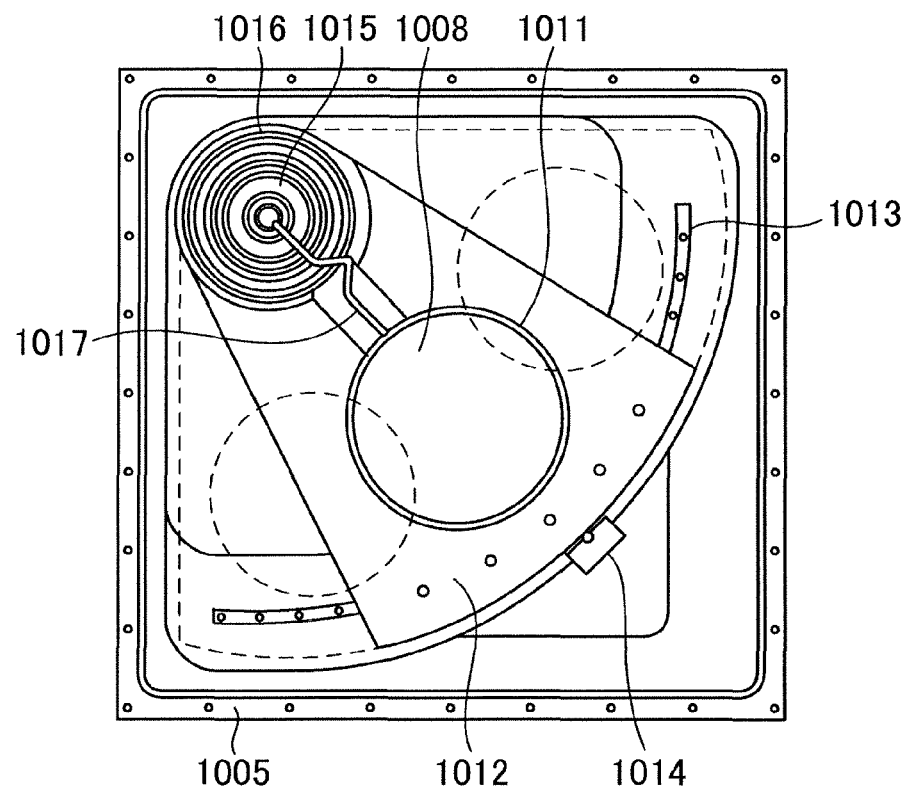
FIG. 11 is a plan view of a stage system in accordance with an embodiment of the present invention.

FIG. 11 is a plan view of a stage system employed in this embodiment. As shown in FIG. 11, the stage system of this embodiment is equipped with a biaxial rotating stage mechanism, basically including a rotating arm 1012 and a rotating stage 1011 mounted thereon. The wafer 1008 is set on the wafer support table 1009 which is mounted on the rotating stage 1011. The rotating arm 1012 is supported by a rotating arm support shaft 1012-a (shown in FIG. 12) at one end. Around the support shaft 1012-a as the center of rotation, the rotating arm 102 swivels while being supported on an arc guide 1013 at the other end (distal end).

In the biaxial rotating stage mechanism employed in the charged particle beam apparatus of this embodiment, all the stage moving mechanisms are arranged on one plane. Differently from ordinary X-Y stages, the need of stacking up the plurality of moving mechanisms is eliminated, realizing a reduced thickness in the vertical direction (low-profile stage mechanism) compared to the X-Y stages.

The rotating arm 1012 is driven by an ultrasonic motor 1014 which is in contact with the tip (side face of the distal end) of the rotating arm 1012. The rotation angle of the rotating arm 1012 can be detected by a rotation angle detector 1016 provided around the rotating arm support shaft 1012-a.

A high-precision rotation angle detector is capable of detecting the rotation angle after movement in less than 0.2 seconds.

The ultrasonic drive motor 1014 (pulse drive) is capable of step-feeding the rotating arm 1012 with an extremely high precision (several nanometers per pulse).

Figure 12:
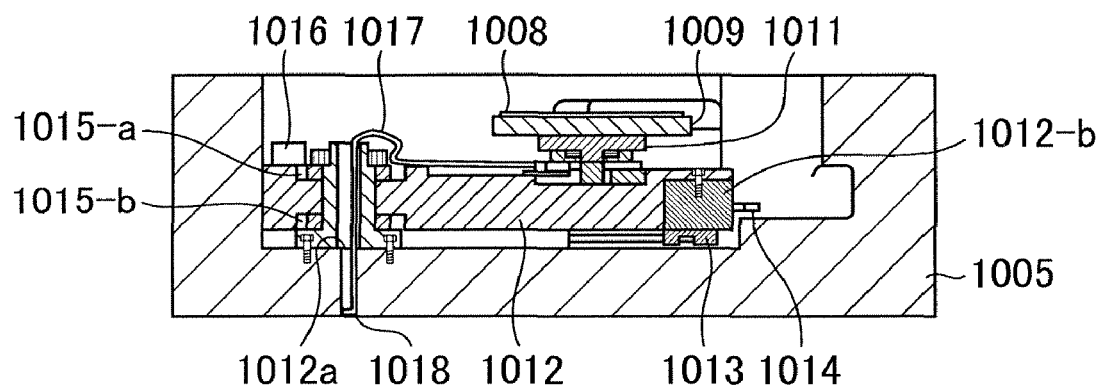
FIG. 12 is a cross-sectional view of the stage system in the embodiment of the present invention.

Incidentally, the ultrasonic drive motor 1014 is fixed by a ceramic plate 1012-b shown in FIG. 12 (cross-sectional view of the stage). The ceramic plate 1012-b, having high rigidity, improves wear resistance during the driving by the ultrasonic motor 1014, enabling stable driving by the motor.

The rotating arm 1012 rotates while being supported by rotation-support bearings 1015 (1015-a, 1015-b). In order to avoid a drop in the arm rigidity in the vertical direction of the wafer 1008 due to the cantilever-like supporting, the arc guide 1013 is provided. The distal end of the rotating arm 1012 is driven and rotated while being supported on the arc guide 1013. With this configuration, the rigidity is improved and the arm is prevented from rattle in the vertical direction.

The eccentricity can be reduced to less than 0.5 μm by using the rotation-support bearings (1015-a, 1015-b) of the ultra-precision class. Positional reproducibility in the horizontal plane in repeated measurement can be better than 0.5 μm.

The sample stage 1010 is formed by the rotating stage 1011, the rotating arm 1012, the support shaft 1012-a, the arc guide 1013, the ultrasonic motor 1014, etc. The reference numerals "1017" and "1018" represent a lead wire and a wiring connector, respectively.

An important point in the configuration of the sample stage 1010 is that the rotating arm 1012 rotates around the rotating arm support shaft 1012-a provided inside the sample chamber 1005 and the tip of the arm 1012 is directly driven by the ultrasonic drive motor 1014. In other words, the driver of the rotating arm is provided not on the support shaft's side of the rotating arm but on the tip's side of the rotating arm (where the rotating stage is mounted) and the tip of the rotating arm is driven and rotated along the arc guide. Thus, the driver is relieved of the need of high-precision rotation control. By using a non-backlash motor such as the ultrasonic motor as the driver, a rotating arm involving no cause of backlash and being capable of remarkably high-precision driving can be realized.

Further, since the rotation angle detector 1016 is provided directly on the rotating shaft 1012-a, rattle etc. that can be caused by an interlock system or vacuum sealing mechanism (O-ring, magnetic fluid seal, etc.) or by the twisting of a shaft (in a conventional and general configuration with a driving system placed outside the vacuum chamber) can be reduced. Thus, a direct motor-drive rotating arm of extremely high precision can be realized.

Furthermore, such a mechanism unit mainly composed of the rotating arm 1012 and the rotating stage 1011 (like the stage structure shown in FIGS. 11 and 12) is characteristic in that it can be downsized (low-profiled) further. Therefore, the sample chamber 1005 can also be low-profiled. Since the thickness of the conventional X-Y stage amounts to 250 to 300 mm even for 8 inch wafers, the conventional sample chamber is necessitated to be still larger in the depth direction (vertical direction). Conventionally, the sample chamber is fabricated by joining five thick-walled members (plates) for the base and four side faces together by welding and then carrying out brazing by the technique called "oven brazing".

Since the sample chamber 1005 is a vacuum container, the side faces of the chamber 1005 receives high pressure in the vacuum state and are deformed slightly. To reduce the deformation, preparation and processing of extremely thick-walled members (plate thickness: 25 to 30 mm) have been necessary.

However, even with the welding or the oven brazing technique, it is still difficult to join the members together perfectly avoiding voids. The chamber is necessitated to have weak parts and be susceptible to external microvibration.

In contrast, the biaxial rotating stage mechanism of this embodiment allows for the low-profiling and downsizing of the sample stage 1010 itself. Therefore, the sample chamber 1005 can be made just by forming room for the movement of the stage mechanism inside a block-shaped material (e.g., thick-walled iron, permalloy, invar or aluminum alloy (which can be aluminum containing carbon nanotubes)), by directly performing a cutting operation (boring) to the block material. Thus, in addition to the downsizing of the sample chamber, a minimum vacuum sample chamber with extremely high rigidity and less wasted space can be configured.

This means that a higher degree of vacuum can be achieved even if the vacuum pump of the same evacuation speed is used. Thus, the vacuum atmosphere can be made cleaner. Thanks to the high rigidity, the deformation of the chamber caused by vacuum evacuation is small, achieving higher resistance to external vibration.

Specifically, even for a 450 mm sample stage, the sample chamber can be made by boring the block material to a depth of 150 to 200 mm.

Further, since the tip of the rotating arm 1012 is supported by the arc guide 1013, the arm is allowed to have high rigidity and extremely high resistance to vibrations from outside, especially to sonic vibration.

The wires to the motor for driving the rotating stage 1011 and to the rotation angle detector may be drawn out through a wire-extracting part formed at the center of the rotating arm support shaft 1012-a and laid along the arm. With this configuration, swinging back of the wires just after the swiveling of the rotating arm 1012 can be prevented almost perfectly, eliminating the possibility of a ground fault caused by friction of the wires and realizing a highly reliable stage system.

Next, effects of heat generated by the ultrasonic drive motor 1014 in this embodiment will be explained referring to FIGS. 11, 12 and 13.

Referring first to FIG. 11, since the ultrasonic drive motor 1014 is fixed on the bottom of the sample chamber 1005, most of the heat generated by the motor 1014 is transmitted to the walls of the sample chamber 1005. Transmission of the heat to the rotating arm 1012 is negligible, producing no effect on the arm 1012.

Figure 13:
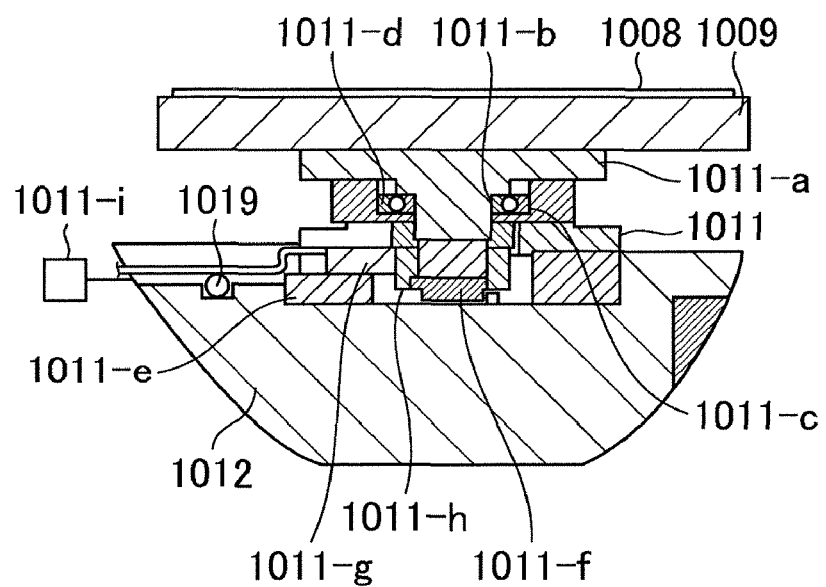
FIG. 13 is a cross-sectional view of the rotating stage in the embodiment of the present invention.

In contrast, as shown in FIG. 13 (detailed cross-sectional view of the rotating stage 1011), the rotating stage 1011 is equipped with an ultrasonic motor (R) 1011-g for driving and rotating the stage 1011. The ultrasonic motor 1011-g is fixed on a rotating stage table 1011-e. Since the rotating stage table 1011-e is fixed on the rotating arm 1012, most of the heat generated by the ultrasonic motor (R) 1011-g is transmitted to the rotating arm 1012.

Thus, temperature rise of the rotating arm 1012 due to continuous stage driving is inevitable. Assuming that aluminum alloy (linear expansion coefficient: $2 \times 10^{-5}$) is used for the rotating arm 1012, the arm 1012 (500 mm long, for example) expands and contracts by approximately 10 μm per ° C. In consideration of the change in the arm length, the temperature of the rotating arm 1012 is detected by a temperature sensor 1019 attached to the arm. The correct value of the arm length (i.e., the distance R1 from the rotation center of the rotating arm 1012 to the rotation center of the rotating stage 1011) can be obtained by calculating the expansion/contraction of the arm length caused by the temperature change and correcting the original arm length by the calculated expansion/contraction. Specifically, to correct the rotating arm length by detecting the temperature, the rotating arm length R1 at the measured temperature is calculated by use of the measurement result by the temperature sensor 1019, the linear expansion coefficient of the arm material and a rotating arm length R10 at a reference temperature (e.g., 0° C.). The calculated arm length R1 is stored in a memory and thereafter used for the error correction control and the rotation control explained in the first embodiment and later in this embodiment. The above process for calculating R1 is executed by the stage control unit 1102, for example. The memory for storing numeric data such as the linear expansion coefficient, R10 and the calculated R1 is also placed in the stage control unit 1102.

In this case, a sensor made of nonmagnetic material is desirable for the temperature sensor 1019 to avoid changes in leaking magnetic fields from the lens and the like.

As another countermeasure against the temperature rise of the rotating arm 1012, it is also possible to prevent the temperature rise and eliminate its effect by adding temperature control means to the rotating arm 1012. For example, the temperature change can be reduced to the minimum by cooling the arm 1012 with a Peltier device or a flexible cooling tube circulating a coolant therein, while using the output of the temperature sensor as feedback.

Next, the rotating stage 1011 will be explained in more detail referring to FIG. 13.

In FIG. 13, the rotating stage 1011 is mounted on the rotating arm 1012. A roller guide (a) 1011-b as an inner ring is joined to the rotating shaft 1011-a. For precise rotation of the stage 1011, a ceramic material is used for the roller guide 1011-b since a material having high rigidity and solidity is desirable.

Rollers 1011-d are sandwiched between the roller guide 1011-b and a roller guide 1011-c (outer ring), allowing for the rotation of the rotating shaft 1011-a. A tubular body 1011-h is joined to the rotating shaft 1011-a. The ultrasonic drive motor (R) 1011-g is installed by the periphery of the tubular body 1011-h.

Similarly to the aforementioned ultrasonic drive motor 1014, the ultrasonic drive motor (R) 1011-g is a drive motor which employs voltage-dependent expansion/contraction of a piezoelectric element as its basic principle and which is widening the range of application in recent years. Details of the ultrasonic drive motor are described in "Tribology Series—Tribological Research and Design for Engineering Systems (2003), pages 461-468", "Application of Alumina to Ultrasonic Motor for Electron Beam Photolithography Apparatus, Journal of the Ceramic Society of Japan, Ceramics, Vol. 37 (2001), pages 39-41", etc.

These literatures have proposed various types of nonmagnetic ultrasonic motors capable of successive movement in minute steps and especially, high-precision operation even in a vacuum.

The ultrasonic drive motor (R) 1011-g which is in engagement or contact with the tubular body 1011-h is powered and driven by a driving power supply 1011-i. While the ultrasonic drive motor 1011-g exerts rightward or leftward driving force to the object, the driving force of the ultrasonic drive motor is transmitted to the tubular body 1011-h as rotational motion since the tubular body 1011-h is a rotating body.

A rotation angle detector (R) 1011-f formed by an encoder etc. is arranged at the base of the tubular body 1011-h to detect the rotation angle of the tubular body 1011-h. The rotating stage table 1011-e, as a pedestal plate serving as the base of the rotating stage 1011, is fixed on the rotating arm 1012.

The wafer support table 9, on which the wafer 1008 is set, is fixed on the rotating shaft 1011-a. The tubular body 1011-h is also fixed to the rotating shaft 1011-a. Thus, the driving force of the ultrasonic drive motor (R) 1011-g is transmitted from the tubular body 1011-h to the rotating shaft 1011-a directly and correctly, rotating the wafer support table 1009 and the wafer 1008 with remarkably high precision.

Next, the method for measuring the rotation angle of the rotating arm 1012 using the encoder will be explained.

Figure 18:
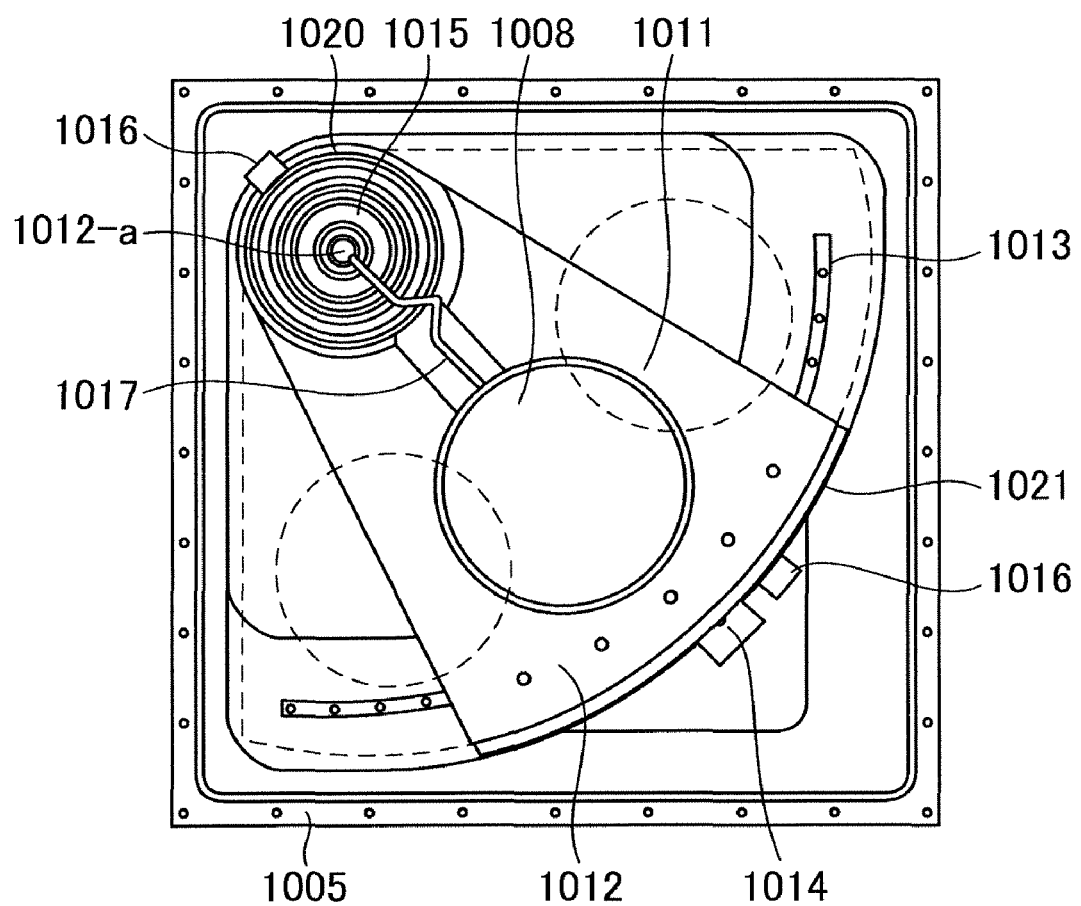
FIG. 18 is an explanatory diagram showing the setting position of a rotation angle detector in the embodiment of the present invention.

For detecting the position of the rotating arm 1012, an angular scale 1020 (shown in FIG. 18), made of material of a low thermal expansion rate and having a peripheral part inscribed with a plurality of lines at preset intervals (pitch: approximately 20 μm) by a laser or the like, is attached around the rotating arm support shaft 1012-a. The rotation detector 1016 includes a light emitting unit (e.g., semiconductor laser) and a photoreceptor unit for receiving reflected light via a diffraction grating. The angular position of the rotating arm 1012 is detected by irradiating a line of the angular scale 1020 with the light from the rotation detector 1016 and then recognizing the irradiated line based on the reflected light.

The precision of the angle measurement can be increased further by applying a tape scale 1021 (shown in FIG. 18), as the angular scale 1020 made in a tape-like form, on the arc of the rotating arm 1012 and reading the tape scale 1021 with the rotation detector 1016. Incidentally, the configuration described above relates exclusively to the biaxial rotating stage mechanism, and thus the action and effects explained above can also be achieved even when the inspection mechanism is placed not on the locus of rotation of the rotating arm differently from the first embodiment. Similarly, the same effects can be achieved when the above configuration (biaxial rotating stage mechanism) is employed for an optical wafer inspection apparatus.

Next, the method for positioning the charged particle beam irradiating position on the wafer in the stage system explained above will be described in detail. For the positioning of the irradiating position, calculations and operation control are carried out by the system control/image processing calculation unit 1106.

Figure 14:
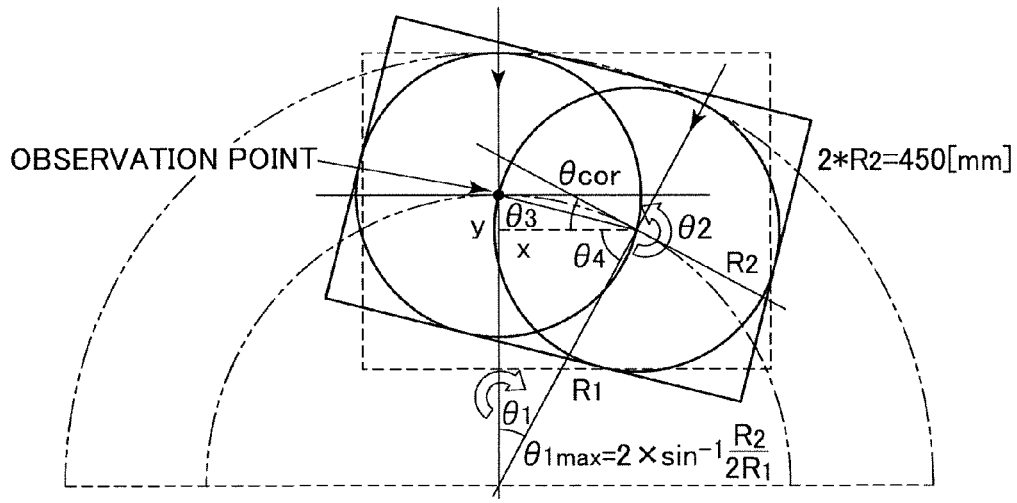
FIG. 14 is an explanatory diagram for explaining positioning of the rotating stage in the embodiment of the present invention.

FIG. 14 is an explanatory diagram for explaining the method for conducting the positioning by the rotations of the rotating arm 1012 and the rotating stage 1011 in the charged particle beam optical system. In FIG. 14, the reference character "R1" represents the turning radius of the rotating arm 1012 and "R2" represents the radius of the semiconductor wafer.

Patterns of semiconductor processes to be conducted onto the wafer have been patterned in the X-Y coordinate system, and the shapes and coordinates (positions) of the patterns have been determined as CAD information in the design phase.

Therefore, the positional information in the X-Y coordinate system has to be transformed into coordinates in the polar coordinate system by use of the rotation angle S1 of the rotating arm 1012 and the rotation angle S2 of the rotating stage 1011.

Figure 15:
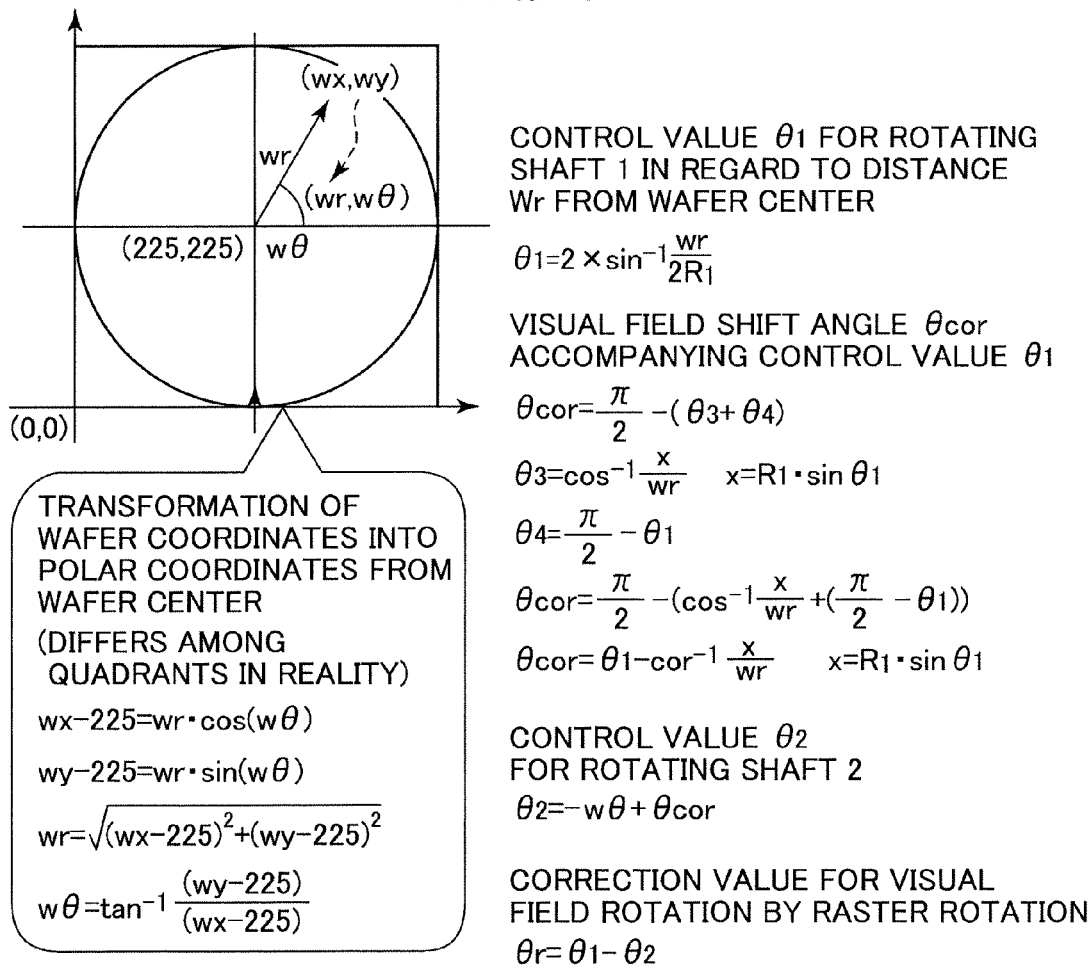
FIG. 15 is an explanatory diagram for explaining rotating shaft control values in an embodiment of the present invention.

FIG. 15 is an explanatory diagram for explaining equations representing the control values of the rotation angles S1 and S2.

In conclusion, the control value S1 for the rotating arm 1012 in regard to the distance Wr from the wafer center to the target irradiating position of the charged particle beam can be expressed by the following equation (8).

$$S1 = 2 \times \sin^{-1}(Wr/(2R1)) \quad (8)$$

Meanwhile, the control value S2 for the rotating stage 1011 can be expressed by the following equation (9).

$$S2 = -wS + Scor \quad (9)$$

where wS and Scor are expressed by the following equations (10) and (11).

$$wS = \tan^{-1}((Wy-225)/(Wx-225)) \quad (10)$$

$$Scor = S1 - \cos^{-1}(x/Wr) \quad (11)$$

where $x = R1 \cdot \sin S1$.

Further, in order to acquire an erect image (requiring no rotation of the visual field) in the charged particle beam optical system, a correction can be made by means of the raster rotation for the visual field rotation. The correction value can be obtained by calculating S1-S2.

Figure 16:
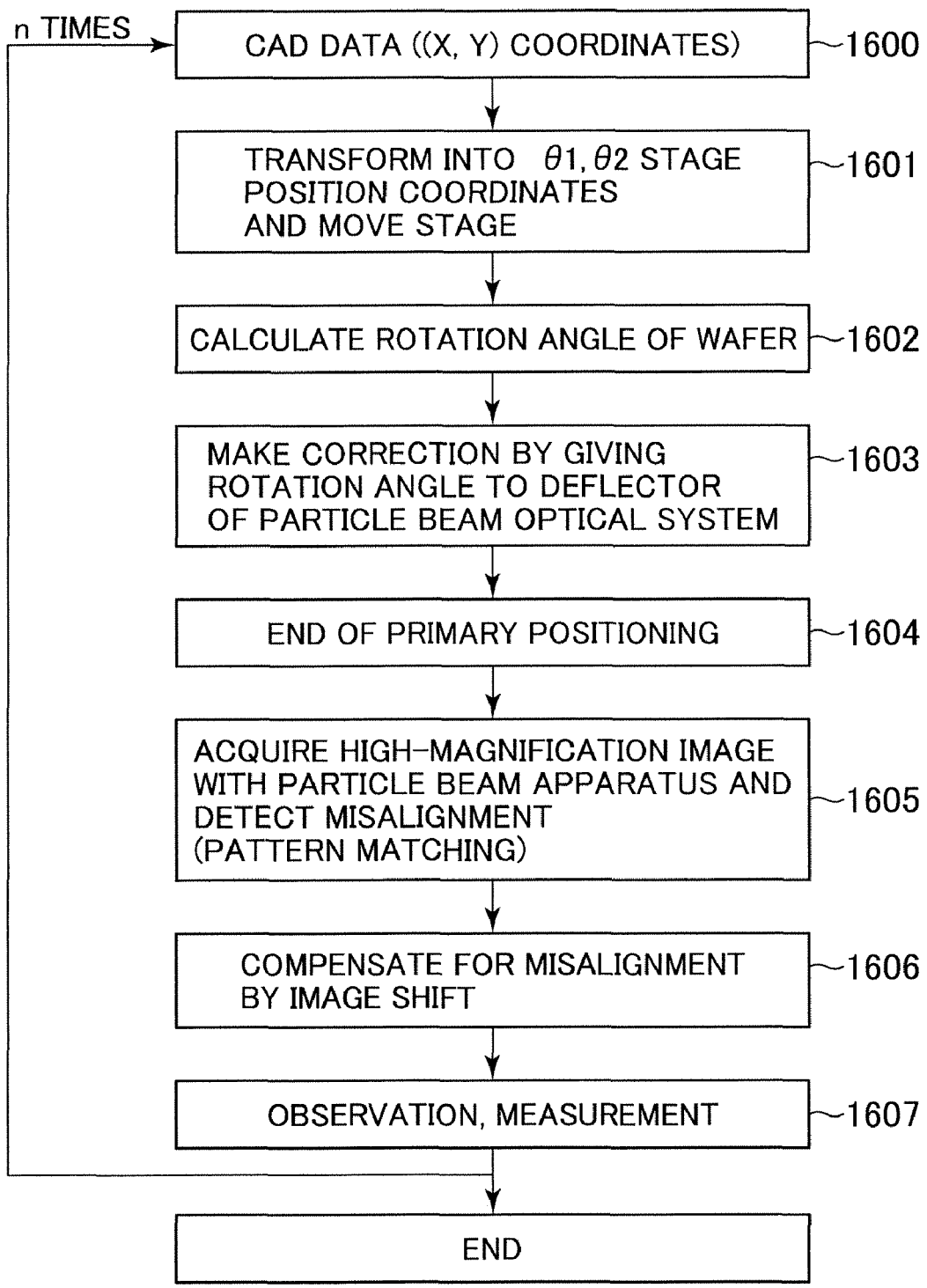
FIG. 16 is a flow chart for explaining a positioning sequence in the embodiment of the present invention.

FIG. 16 is a flow chart showing a concrete sequence of the positioning operation in the case where the charged particle beam apparatus of this embodiment is applied to a length measurement SEM.

In the first step 1600 in FIG. 16, CAD data in the X-Y coordinate system are given in regard to the patterns on the wafer. The (X, Y) coordinates are transformed into stage coordinates represented by S1 and S2 (polar coordinate transformation) and stage movement is carried out (step 1601).

Subsequently, the rotation angle of the wafer for acquiring an erect image is calculated from S1 and S2 (step 1602) and a rotation angle correction is conducted to the deflector 1004 of the particle beam optical system (step 1603), by which the displayed image can be adjusted to an erect image.

At this stage, a primary positioning is completed (step 1604).

The term "primary positioning" is used here for the following reason: The driving by the motors 1011-*g* and 1014 is carried out at this stage based on the result of detection by the rotation angle detectors 1011-*f* and 1016 arranged at the rotating shafts 1011-*a* and 1012-*a*. However, the rotational positioning accuracy of each rotating shaft (1011-*a*, 1012-*a*) involves an error of 0.5 to several μm due to error factors such as the rotation axis shift (which is dependent on the roundness of the rotating shaft) and the measurement error of the rotation angle detector. The error makes it difficult to carry out the positioning on the sub-micron order at this stage.

Thus, as the secondary stage, in the high-magnification image acquired by the charged particle beam apparatus, the actual pattern image and a figure (graphic) drawn based on the pattern data created with the CAD system are both displayed and the misalignment (positional error) is detected by a pattern matching technique (step 1605).

For example, when the visual field of the actual image is 10 μm square and 1000 pixels are arranged both in X and Y directions in the visual field (each pixel corresponds to 10 nm), the misalignment can be detected by the pattern matching with a precision of approximately 10 nm. After the misalignment is detected, the misalignment is compensated for by means of the image shift by the particle beam apparatus (step 1606) and thereafter the displaying of a magnified image of the intended pattern or the measurement of shapes, dimensions, etc. may be carried out (step 1607).

When there are numbers of measurement points on the wafer, it is possible to successively reach the pattern positions and conduct the observation/measurement at the positions, by returning from the step 1607 to the step 1600 and repeating the above sequence n times.

In the case of a defect review SEM, the observation positions on the wafer have already been roughly located by use of an appearance inspection device. Therefore, the defect coordinates acquired by the appearance inspection device are transformed into polar coordinates in the step 1601. In the step S1605, instead of executing the pattern matching between the actual image and the pattern data generated from the CAD data, the misalignment is detected using the actual image only so that a defect position in the actual image can be placed at the center of the visual field.

By using the above method for patterns on an arbitrary wafer, it becomes possible to automatically reach a pattern to be measured and conduct the measurement of the intended pattern.

Next, a method for detecting the notch of the wafer and conducting global alignment will be explained. This method has a characteristic in that optical microscopes are arranged over a locus that is drawn by the rotation center of the rotating stage according to the movement of the rotating arm 1012 with respect to the center D of the particle beam optical system.

Figure 17:
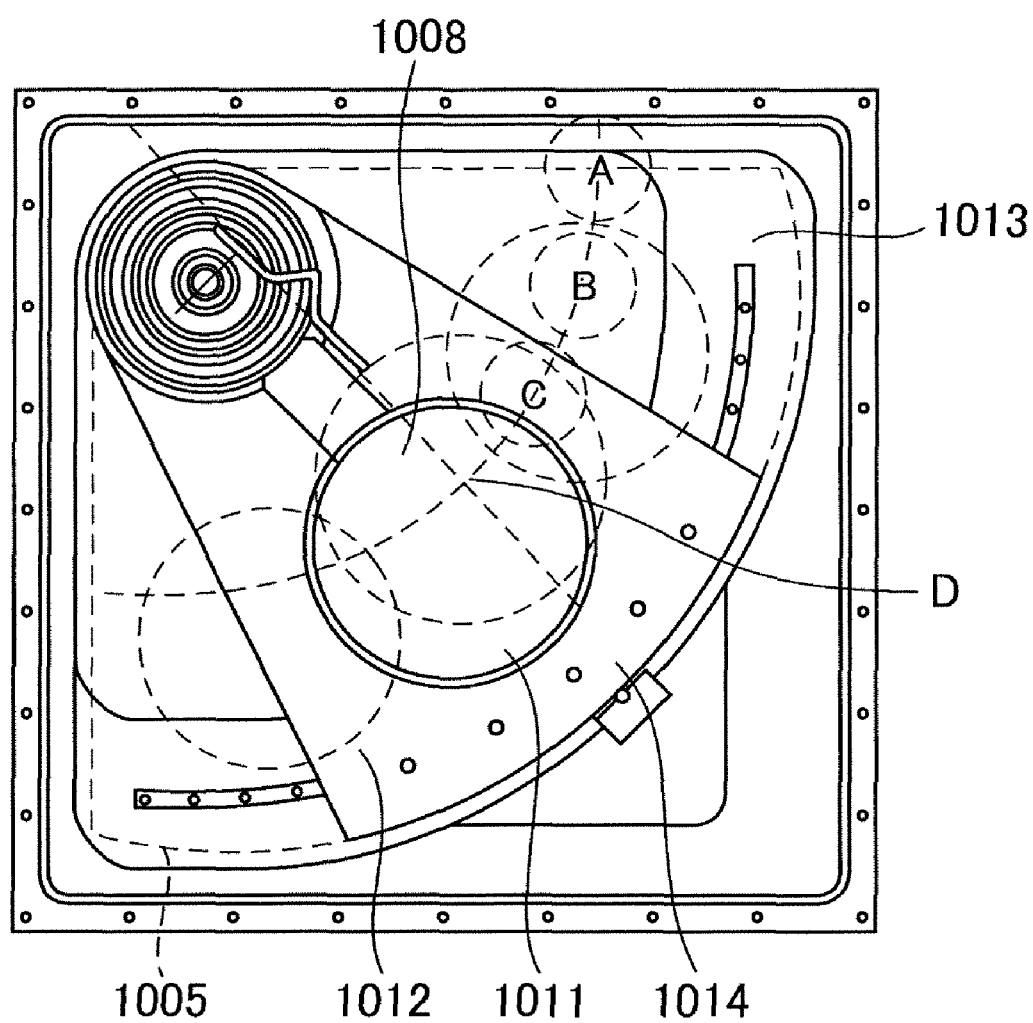
FIG. 17 is a diagram showing an example of arrangement of optical microscopes etc. in the embodiment of the present invention.

FIG. 17 is a diagram showing an example of the arrangement of the optical microscopes.

In FIG. 17, a low-magnification optical microscope (position A), a high-magnification microscope (position B) and a polarization microscope (position C) are arranged over the locus drawn by the rotating stage rotation center according to the movement of the rotating arm 1012 with respect to the center D of the particle beam optical system. Since an optical microscope having a large visual field is arranged, the periphery and the notch part of the wafer can be detected by first adjusting a peripheral part of the wafer to the center of the visual field using the rotating arm 1012 and then rotating the wafer using the rotating stage 1011.

The high-magnification optical microscope is set at the position B, with which the wafer alignment can be conducted with higher precision. Subsequently, the rotating stage 1011 is moved to a position D. At the visual field center of the particle beam optical system, alignment with still higher precision can be carried out as needed.

The film deposited on the wafer can be of a quality barely visible with an ordinary optical microscope. In such cases, the polarization microscope can be used instead. Thus, the polarization microscope may be set at the position C and one or more appropriate microscopes may be selected and used depending on the purpose.

In either case, the global alignment can be conducted quickly with an optical microscope and the wafer after the global alignment can be fed to the particle beam optical system. Therefore, the inspection can be executed in a short time and the throughput can be increased.

In the configuration shown in FIG. 17, by first adjusting an edge part of the wafer to the optical microscope position B using the rotating arm 1012 and then gradually rotating the wafer 360 degrees at the position with the rotating stage 1011, defects etc. in the wafer's edge part can be detected successively. Subsequently, the defects etc. detected with the optical microscope can be reviewed by first moving the wafer to the position D of the charged particle beam optical system using the rotating arm 1012 and then gradually rotating the wafer 360 degrees at the position with the rotating stage 1011.

As above, data of images of observation positions existing on the wafer can be acquired successively by the rotation of the rotating stage 1011 alone. Further, the image data acquisition can be carried out with high positioning accuracy and high speed. These effects can be achieved also by applying this configuration to a length measurement SEM.

Specifically, paths of defect observation points existing on the wafer (review paths) or paths of measurement points (where the length measurement should be performed) existing on the wafer (length measurement paths) are set like concentric circular paths including (i.e., passing through) all the observation/measurement points. Image data are acquired by rotating the rotating stage while gradually moving the wafer in its radial direction (from its outermost part or central part) with the rotating arm (rotation in a concentric fashion). By this method, data of the peripheral part of the wafer can be successively acquired with high efficiency and high speed.

It is said that the defects existing on the wafer tend to be distributed concentrically (distribution varying in the wafer's radial direction from the wafer center) and the number of defects increases especially in the peripheral part of the wafer. Therefore, the above path setting method is effective especially when it is employed for a defect review SEM, with which a remarkably desirable system with high throughput can be realized.

In the above path setting method, the coordinates of all the image acquiring positions on the wafer are transformed into polar coordinates. The defect position coordinates obtained by the transformation are classified into groups (grouping) according to the radial position (R component of the polar coordinates). In each group, the S component of the defect position coordinates corresponds directly to the rotation angle of the rotating stage. Meanwhile, the rotation angle of the rotating arm is calculated from the interval between groups in the radial direction. The calculation process for the above path setting is executed by the system control/image processing unit 1106. Path information set by the unit 1106 is sent to the stage control unit 1102 and used for the stage control.

Incidentally, when the concentric circular review/measurement path enters the inner dead zone explained in the first embodiment, the image acquisition is carried out by switching the path movement into the image shift. In this control, the path information calculated by the system control/image processing unit 1106 (coordinate information on the current image acquiring position and the next image acquiring position) is sent to the lens/deflector control unit 1104. The lens/deflector control unit 1104 calculates image shift values and thereby controls the deflector 4. Therefore, the stage control unit 1102 (which has prestored coordinate information on the boundary of the inner dead zone) judges whether the current image acquiring position has entered the boundary or not and sends the result of the judgment to the lens/deflector control unit 110 together with the aforementioned path information, while also stopping the driving of the rotating stage and the rotating arm. The lens/deflector control unit 1104 starts the image acquisition by the image shift based on the judgment information from the stage control unit 1102.

The position B of the optical microscope and the position D of the charged particle beam optical system are fixed positions in a one-to-one correspondence. Thus, a position (of a defect etc. that should be reviewed) detected with the optical microscope can be reviewed precisely and without fail at the position D with a SEM, for example.

Further, by storing a defect image acquired with the optical microscope in an image memory, subsequently storing a charged particle beam image of a corresponding position in the image memory, and thereafter conducting a comparative analysis of the stored images, the defective part can be studied more correctly and precisely.

As described above, according to an example of this embodiment, a charged particle beam apparatus that includes a stage system adapting to the miniaturization, having high positioning accuracy, being resistant to external vibration and being implementable at a low cost, can be realized.

Specifically, the rotating shaft 1012-*a* of the rotating arm 1012 is supported by the bearings 1015-*a* and 1015-*b* in a vacuum. The shaft 1012-*a* is equipped with the rotation angle detector 1016, and the ark-shaped part at the end of the rotating arm 1012 is directly driven by the ultrasonic drive motor 1014, enabling high precision driving without rattle, etc.

The guide mechanism 1013 for supporting a part of the rotating arm 1012 is arranged nearby the end of the rotating arm 1012. By letting the arm 1012 rotate along the guide mechanism 1013, the cantilever-like supporting of the rotating arm 1012 extending from the rotating shaft 1012-*a* is avoided, realizing a rotation drive mechanism with high resistance to external vibration, high resonant frequency and high rigidity.

Further, downsizing of the whole sample stage 1010 is possible since the movement (movable range) of the rotating arm 1012 can cover the whole area of the wafer in cooperation with the rotating stage 1011 if the arm's stroke is approximately half the wafer diameter.

Thanks to the downsizing of the sample stage 1010, the sample chamber 1005 enclosing the sample stage 1010 can also be downsized. Consequently, the resistance to external vibration is increased due to the improvement of rigidity of the sample chamber 1005 itself, as well as realizing high-speed vacuum evacuation (thanks to the decrease in the vacuum capacity) and cost reduction.

The positioning to a micropattern formed on the wafer (by the stage system which drives the rotating shaft 1012-*a* of the rotating arm 1012 and the rotating stage 1011) is carried out using coordinate information on the wafer pattern (CAD data). The CAD information (prepared in the X-Y coordinate system) is transformed into the rotating coordinate system regarding the two types of rotations (rotation of the rotating arm 1012, rotation of the rotating stage 1011). The positioning is then carried out by rotating the shafts 1011-*a* and 1012-*a*.

The angle of the wafer in the direction of the rotation has a deviation from the scanning direction of the charged particle beam apparatus at the point when the positioning is finished. Therefore, by giving a calculated rotation angle to the particle beam scanning direction of the apparatus as a rotation angle correction value, an erect image with respect to a predetermined direction (e.g., direction of the notch of the wafer) can be acquired constantly.

The configurations explained in the first embodiment and second embodiment are basically applicable also to an optical wafer inspection apparatus except for the part about the control of the charged particle beam. There are two types of optical wafer inspection apparatuses: those conducting inspections in a vacuum sample chamber and those conducting inspections in the air (having no vacuum sample chamber). Even for an optical wafer inspection apparatus of the type having no vacuum sample chamber, introduction of the biaxial rotating stage mechanism has the advantage of reducing the installation area of the apparatus. Therefore, an optical wafer inspection apparatus saving space and achieving high precision of inspection can be realized by employing the configurations explained in the embodiments.

DESCRIPTION OF THE REFERENCE NUMERALS

101 Sample chamber
102 Rotating arm
103 Rotating stage
104 Control computer
105 Man-machine interface
106 Storage unit
107 Input device
108 Wafer transfer unit
109 Wafer transfer robot
110 Gate valve
111 Load port
112 Pod
201 Wafer coordinate system
202 Stage coordinate system
203 Inspection mechanism setting position
204 Rotation center of rotating arm
205 Rotation center of rotating stage
206 Inspection mechanism mounting position margin
207 Outer unobservable area
208, 301 to 303, 401 to 403 Inspection mechanism setting position
304 to 306 Margin
307 Charge measurement instrument mounting position
308 Charge remover mounting position
309, 404 Edge/bevel inspection mechanism mounting position
501 Locus of stage center mark accompanying rotation
502, 503 Center shift (X, Y) accompanying rotation
504 Error in the amount of rotation
601 Rotating stage rotation center with respect to visual field center
602 Rotating stage rotation center after S1 adjustment
603 Misalignment in the rotating arm axis direction
701 On-screen position of the V-shaped notch
702 Misalignment of wafer center
801 Wafer-to-polar coordinate transformation unit
802 Polar-to-biaxial rotating stage coordinate transformation unit
803 Wafer center misalignment data
804 Wafer center misalignment data
805 Misalignment data of rotating stage rotation center with respect to visual field center
806 Data of the error in the amount of rotation
807 Data of stage center shift (X, Y) accompanying rotation
808 Inputted coordinates
809 Inspection mechanism designation
810 Inspection mechanism mounting position (rotating arm angle)
901 Optical inspection device
902 Optical microscope
903 Charged particle beam inspection device
904 Charge measurement instrument
905 Charge remover
906 Edge/bevel inspection mechanism

The invention claimed is:

1. A charged particle beam apparatus for conducting inspection or measurement of a target sample using a secondary particle image, the apparatus comprising:
a biaxial rotating stage mechanism including a rotating stage which rotates the target sample placed thereon around a prescribed rotation center, a rotating arm which supports the rotating stage and moves the rotating stage along an arc-shaped path, means for driving and rotating the rotating stage, and means for driving the rotating arm; and
a plurality of inspection mechanisms including a charged particle optical lens tube for acquiring the secondary particle image by irradiating the target sample with a primary charged particle beam,
wherein the plurality of inspection mechanisms are arranged over a locus that is drawn by the rotation center of the rotating stage according to the rotation of the rotating arm.

2. The charged particle beam apparatus according to claim 1,
wherein a minimum movable range of the rotating arm is set so that maximum distance between rotation centers of the rotating stage within the rotating arm's movable range is greater than the radius of the sample.

3. The charged particle beam apparatus according to claim 2,
wherein the minimum movable range of the rotating arm is set to further expand by a permissible misalignment caused by a setting position error of the inspection mechanism or a rotational error of the rotating arm.

4. The charged particle beam apparatus according to claim 1, further comprising:
a stage control unit which controls the operation of the rotating stage and the rotating arm by transforming orthogonal coordinate values of an image acquiring position on the sample into polar coordinate values.

5. The charged particle beam apparatus according to claim 1,
wherein the plurality of inspection mechanisms include an optical microscope in addition to the charged particle optical lens tube.

6. The charged particle beam apparatus according to claim 5,
wherein the plurality of inspection mechanisms include a surface electric field measurement instrument or a charge remover.

7. The charged particle beam apparatus according to claim 1, wherein:
a turning radius R1 of the rotating arm is substantially equal to a turning radius R2 of the rotating stage; and
edge/bevel inspection means is arranged substantially over a circumference along the locus of the movement of the rotating arm.

8. The charged particle beam apparatus according to claim 1, further comprising:
means for compensating for eccentricity of the rotating stage.

9. The charged particle beam apparatus according to claim 8, further comprising:
a stage control unit which calculates a correction value for the eccentricity compensation by calculating deviation of the real rotation center of the rotating stage from an ideal rotation center based on information on a locus drawn by the rotation center of the rotating stage according to the rotation of the rotating stage.

10. The charged particle beam apparatus according to claim 1, further comprising:
   control means which sets paths connecting acquiring positions of the secondary particle images on the sample as concentric circular paths.

11. The charged particle beam apparatus according to claim 10,
   wherein the apparatus acquires an image by an image shift when the path set by the control means enters a dead zone of the apparatus.

12. A charged particle beam apparatus for conducting inspection or measurement of a target sample using a secondary particle image, the apparatus comprising:
   a biaxial rotating stage mechanism including a rotating stage which rotates the target sample placed thereon around a prescribed rotation center, a rotating arm which supports the rotating stage and moves the rotating stage along an arc-shaped path, means for driving and rotating the rotating stage, and means for driving the rotating arm; and
   a plurality of inspection mechanisms including a charged particle optical lens tube for acquiring the secondary particle image by irradiating the target sample with a primary charged particle beam,
   wherein the biaxial rotating stage mechanism includes:
      a support shaft which is provided at an end of the rotating arm opposite to the rotating stage supporting position and serves as a rotation center of the rotating arm;
      a guide mechanism which supports a basal part of the other end of the rotating arm opposite to the support shaft; and
   a driver which moves the rotating arm along the guide mechanism.

13. The charged particle beam apparatus according to claim 12, wherein the driver is a non-backlash motor.

14. The charged particle beam apparatus according to claim 13, further comprising:
   a rotation angle detector which detects a rotation angle of the rotating arm.

15. The charged particle beam apparatus according to claim 14, wherein:
   wires for the rotating arm driver and the rotation angle detector are laid along the rotating arm; and
   a wire-extracting part is formed in the vicinity of the support shaft of the rotating arm.

16. The charged particle beam apparatus according to claim 12, further comprising:
   a temperature sensor which measures temperature of the rotating arm; and
   calculation means which calculates a turning radius of the rotating arm from temperature data obtained by the temperature sensor, and calculates a rotation control value for the rotating arm or the rotating stage from the calculated turning radius.

17. The charged particle beam apparatus according to claim 12, further comprising:
   a temperature sensor which measures temperature of the rotating arm;
   temperature adjustment means which adjusts the temperature of the rotating arm; and
   calculation means which controls operation of the temperature adjustment means using temperature data obtained by the temperature sensor.

18. The charged particle beam apparatus according to claim 12, further comprising:
   a drive motor employing a piezoelectric element or an ultrasonic motor as driving means for the rotating stage or the rotating arm.

19. A method for acquiring a charged particle image using a charged particle beam apparatus having a biaxial rotating stage mechanism including a rotating stage which rotates a target sample placed thereon around a prescribed rotation center; a rotating arm which supports the rotating stage and moves the rotating stage along an arc-shaped path; means for driving and rotating the rotating stage; means for driving the rotating arm; and a plurality of inspection mechanisms including a charged particle optical lens tube for acquiring a secondary particle image by irradiating the target sample with a primary charged particle beam,
   the method comprising steps of:
   moving an end of the rotating arm opposite to the rotating stage supporting position in order to move an image acquiring position on the sample to a position right under the inspection mechanism; and
   acquiring a charged particle image of the target sample.

* * * * *